United States Patent
Allen et al.

(10) Patent No.: US 12,232,324 B2
(45) Date of Patent: Feb. 18, 2025

(54) METHOD OF FORMING OXIDE-NITRIDE-OXIDE STACK OF NON-VOLATILE MEMORY AND INTEGRATION TO CMOS PROCESS FLOW

(71) Applicant: Infineon Technologies LLC, San Jose, CA (US)

(72) Inventors: Michael Allen, Buda, TX (US); Krishnaswamy Ramkumar, San Jose, CA (US)

(73) Assignee: Infineon Technologies LLC, San Jose, CA (US)

( * ) Notice: Subject to any disclaimer, the term of this patent is extended or adjusted under 35 U.S.C. 154(b) by 192 days.

(21) Appl. No.: 17/954,141

(22) Filed: Sep. 27, 2022

(65) Prior Publication Data

US 2024/0107771 A1    Mar. 28, 2024

(51) Int. Cl.
 *H10B 43/30* (2023.01)
 *H01L 21/02* (2006.01)

(52) U.S. Cl.
 CPC ....... *H10B 43/30* (2023.02); *H01L 21/02129* (2013.01); *H01L 21/02219* (2013.01); *H01L 21/02236* (2013.01)

(58) Field of Classification Search
 CPC ......... H01L 21/02129; H01L 21/02219; H01L 21/02236; H10B 41/30; H10B 41/35; H10B 41/40; H10B 41/41; H10B 41/42; H10B 41/43; H10B 41/44; H10B 41/46; H10B 41/47; H10B 41/48; H10B 41/49; H10B 41/70; H10B 43/00; H10B 43/35; H10B 43/40; H10B 43/50
 See application file for complete search history.

(56) References Cited

U.S. PATENT DOCUMENTS

| | | | |
|---|---|---|---|
| 9,824,895 B1* | 11/2017 | Ramkumar | H01L 21/76202 |
| 2002/0185711 A1 | 12/2002 | Lin | |
| 2008/0093661 A1 | 4/2008 | Joo et al. | |
| 2009/0242957 A1 | 10/2009 | Ma et al. | |
| 2010/0019312 A1* | 1/2010 | Sekine | H10B 43/10 257/326 |
| 2016/0093499 A1* | 3/2016 | Yamabe | H01L 29/792 438/591 |
| 2020/0350213 A1 | 11/2020 | Ramkumar et al. | |

OTHER PUBLICATIONS

WO Search Report and Written Opinion from Application 2022P07182WO (PCT/US23/33728) dated Feb. 2, 2024; 15 pages.

* cited by examiner

*Primary Examiner* — Brook Kebede

(57) ABSTRACT

A fabrication method of a semiconductor device is described. Generally, the method includes forming a customizable oxide-nitride-oxide (ONO) stack over a substrate in an in-situ atomic layer deposition (ALD) tool or chamber. Radical oxidation or oxide deposition process steps are performed to form tunnel dielectric layer overlying the substrate. Silicon nitride deposition process steps are also performed to form a multi-layer charge trapping (CT) layer in which at least some of the process parameters of silicon nitride deposition process steps are adjusted when forming the first and second CT sub-layers of the multi-layer CT layer. Subsequently, radical oxidation or oxide deposition process steps are performed in the ALD tool to form a blocking dielectric layer overlying the multi-layer CT layer.

22 Claims, 15 Drawing Sheets

METHOD OF FORMING OXIDE-NITRIDE-OXIDE STACK OF NON-VOLATILE MEMORY AND INTEGRATION TO CMOS PROCESS FLOW

CROSS-REFERENCE TO RELATED APPLICATIONS

None.

TECHNICAL FIELD

The present disclosure relates generally to non-volatile memory (NVM) cells or devices, and more particularly to silicon (semiconductor)-oxide-nitride-oxide-silicon (semiconductor) (SONOS) based NVM cells or devices; and fabrication methods thereof.

BACKGROUND

NVM is widely used for storing data in computer systems, and typically include a memory array with a large number of NVM cells arranged in rows and columns, or other configurations. For the past several decades, the scaling of features in integrated circuits has been a driving force behind an ever-growing semiconductor industry. Scaling to smaller and smaller features enables increased densities of functional units on the limited real estate of semiconductor chips. The drive for ever-more capacity, however, is not without issue. The necessity to optimize the performance of each device while scaling becomes increasingly significant.

In some embodiments, NVM cells may include at least a non-volatile element, such as charge trapping field-effect transistor (FET), floating gate transistor, that is programmed or erased by applying a voltage of the proper polarity, magnitude and duration between a control/memory gate and the substrate or drain/source regions. For example, in an n-channel charge trapping FET, a positive gate-to-substrate voltage causes electrons to tunnel from the channel and trapped in a charge-trapping dielectric layer by Fowler-Nordheim (FN) tunneling, raising a threshold voltage ($V_T$) or reducing a drain current ($I_D$) of the transistor. A negative gate-to-channel voltage causes holes to tunnel from the channel and trapped in the charge-trapping dielectric layer, lowering the $V_T$ or raising the $I_D$ of the SONOS transistor. In some embodiments, SONOS based memory arrays are utilized and operated as digital data storage devices wherein binary bit (0 and 1) data, based on the SONOS cells' two distinct $V_T$ or $I_D$ levels or values, are stored.

There are demands to use NVM technology, such as SONOS, for analog memory and processing as they possess configurably multiple distinct $V_T$ and $I_D$ (more than two) levels with achievably high precision. SONOS memory cells deliver low latency, power, and noise operations that are desirable for analog processing, including at edge inference computations, such as neuromorphic computing in artificial intelligence (AI) applications. However, multiple-level SONOS memory cells may induce more difficulties in scaling, such as charge retaining in the ONO stack, $V_T$ degradation and/or migration.

It is, therefore, an object of the present invention to propose an improved fabrication process to form the ONO stacks in SONOS memory cells; and integrated such process into baseline complementary metal oxide semiconductor (CMOS) process flow.

BRIEF DESCRIPTION OF THE DRAWINGS

The present invention will be understood more fully from the detailed description that follows and from the accompanying drawings and the appended claims provided below, where:

DETAILED DESCRIPTION

Figure 1:
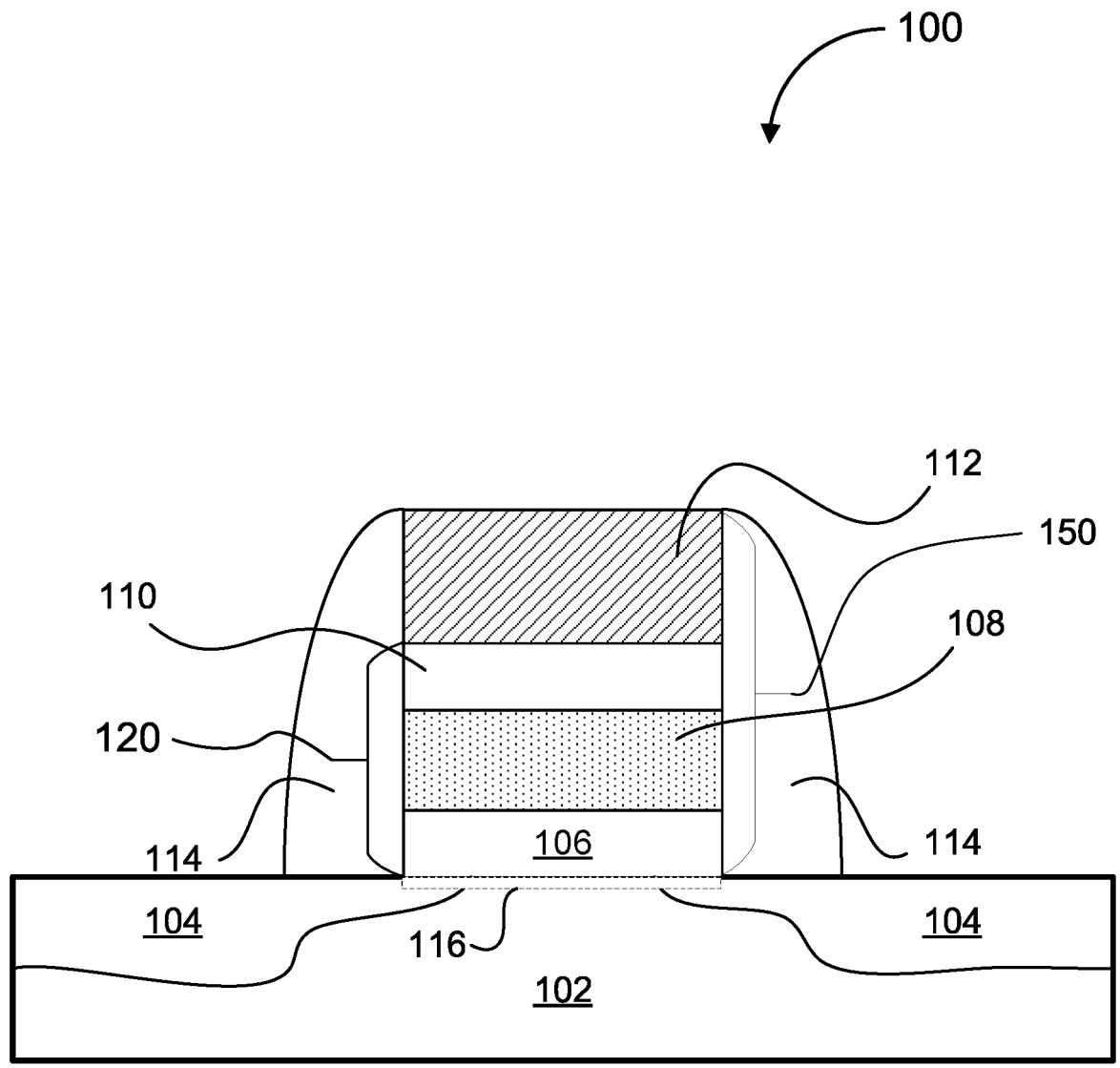
FIG. 1 is a block diagram illustrating a cross-sectional side view of a SONOS based non-volatile memory transistor or device.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

Embodiments of a memory cell including a SONOS based transistor with or without metal-oxide-semiconductor (MOS) transistors or field-effect transistors (FET), and methods of fabricating the same are described herein with reference to figures. However, particular embodiments may be practiced without one or more of these specific details, or in combination with other known methods, materials, and apparatuses in related art. In the following description, numerous specific details are set forth, such as specific materials, dimensions, concentrations, and processes parameters etc. to provide a thorough understanding of the subject matter. In other instances, well-known semiconductor design and fabrication techniques have not been described in particular detail to avoid unnecessarily obscuring the subject matter. Reference in the description to "an embodiment", "one embodiment", "an example embodiment", "some embodiments", and "various embodiments" means that a particular feature, structure, or characteristic described in connection with the embodiment(s) is included in at least one embodiment of the subject matter. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The terms "over", "under", "between", and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. Additionally, the relative position of one layer with respect to other layers is provided assuming operations deposit, modify and remove films relative to a starting substrate without consideration of the absolute orientation of the substrate.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

SUMMARY OF SUBJECT MATTER

According to one embodiment of a method of fabrication of a semiconductor device, the method may include the steps of dividing a substrate into first and second regions and forming a customizable oxide-nitride-oxide (ONO) stack in the first region, performing at least one of a first radical oxidation and a first oxide deposition process steps in an atomic layer deposition (ALD) tool to form a tunnel dielectric layer overlying the substrate, performing a plurality of silicon nitride deposition process steps in the ALD tool to form a multi-layer charge trapping (CT) layer, determining process parameters of a first silicon nitride deposition process step of the plurality of silicon nitride deposition process steps to form a first CT sub-layer, modifying at least one of the process parameters, performing a second silicon nitride deposition process step to form a second CT sub-layer overlying the first CT sub-layer, and performing at least one of a second radical oxidation and a second oxide deposition process steps in the ALD tool to form a blocking dielectric layer overlying the multi-layer CT layer in the first region.

In one embodiment, the silicon nitride formed may include silicon oxynitride that includes oxygen.

In one embodiment, the customizable ONO stack formation process steps are in situ and performed in the same ALD tool.

In one embodiment, the film composition of silicon nitride of silicon, oxygen, and nitrogen, in the first and second CT sub-layers are different. In one embodiment, the first CT sub-layer is oxygen-rich silicon nitride resulting in it being substantially charge trap free and the second CT sub-layer is oxygen-lean silicon nitride resulting in it being substantially charge trap dense.

According one embodiment of the method of fabrication of a semiconductor device, the method may further include the steps of performing a plurality of third silicon nitride deposition process steps to form a plurality of third CT sub-layers disposed between the first and second CT sub-layers, in which process parameters of the plurality of third silicon nitride deposition process steps are adjusted such that oxygen-richness level of the plurality of third CT sub-layers is between oxygen-richness level of the first and second CT sub-layers. In one embodiment, the method further includes the steps of performing at least one of a third radical oxidation and a third oxide deposition process steps in the same ALD tool to form a thin oxide film overlying the first CT sub-layer and underneath the second CT sub-layer, wherein the thin oxide film is formed to reduce electron charge that accumulates at boundaries of the second CT layer from tunneling into the first CT layer.

In one embodiment, the process parameters of the first and second radical oxidation process steps may include the types of reactant gas including $O_2/H_2$ gas, flowrate of the reactant gas into the ALD tool, reaction time for each reactant gas, sequence of the reactant gas entering the ALD tool, and a number of repeating and repeating sequence, in which the process parameters are configured to control at least one of thickness, density, quality of oxide formed in the tunnel dielectric layer.

In one embodiment, the process parameters of the first and second oxide deposition process steps may include types of silicon source precursor gas including HCD, types of reactant gas including $O_2/H_2$ gas, flowrate of the reactant gas and silicon source precursor gas, reaction time for each of the reactant gas and silicon source pre-cursor gas, and sequence of the reactant gas and silicon source pre-cursor gas entering the ALD tool, wherein the process parameters are configured to control at least one of thickness, density, quality of oxide formed in the blocking dielectric layer.

In one embodiment, the process parameters of the first and second silicon nitride deposition process steps may include types of silicon source precursor gas including HCD, types of reactant gas including $NH_3/N_2O$ gas, flowrate of the reactant gas and silicon source precursor gas, and reaction time for each of the reactant gas and silicon source precursor gas, sequence of the reactant gas and silicon source precursor gas entering the ALD tool, and a number of repeating and repeating sequence.

In one embodiment, at least one of the plurality of silicon nitride deposition process steps may be plasma enhanced.

In one embodiment, the first radical oxidation and the first oxide deposition process steps may be individually repeated, alternatively repeated, or a combination thereof to form the tunnel dielectric layer, and the second radical oxidation and the second oxide deposition process steps may be individually repeated, alternatively repeated, or a combination thereof to form the blocking dielectric layer, in which the process parameters of the first and second radical oxidation process steps and the first and second oxide deposition process steps are adjusted during repeating of process steps to customize the tunnel dielectric layer and the blocking dielectric layer.

According to one embodiment of the method of fabrication of a semiconductor device, the method further includes the steps of forming a high voltage (HV) gate oxide layer, an input/output (I/O) gate oxide layer, and a low voltage (LV) gate oxide layer in the second region of the substrate, in which at least one of the HV, I/O, and LV gate oxide layers are formed concurrently with the blocking dielectric layer of the customizable O—N—O layer in the first region by at least one of the second radical oxidation and the second oxide deposition process steps.

In one embodiment, the multi-layer CT layer may include at least three CT sub-layers, and wherein the process parameters of the plurality of silicon nitride deposition process steps are modified such that a top CT sub-layer that is adjacent to the blocking dielectric layer is the most oxygen-lean and a bottom CT sub-layer that is adjacent to the tunnel dielectric layer is the most oxygen-rich in the multi-layer CT layer.

According to an embodiment of a method of fabrication of a memory device, the method may include the steps of forming a tunnel oxide layer in a memory region and a logic region of a substrate, forming a customizable charge trapping (CT) layer and a cap layer overlying the tunnel oxide layer, wherein the customizable CT layer includes multiple CT sub-layers, and wherein each of the CT sub-layers is formed by one or more silicon nitride deposition process step performed in an atomic layer deposition (ALD) chamber, patterning the tunnel oxide, customizable CT, and cap layers to form a memory stack in the memory region while removing those layers in the logic region, and performing at least one radical oxidation process step in the ALD chamber to concurrently converting silicon nitride in at least the cap layer to form a blocking oxide layer overlying the customizable CT layer and converting silicon in the substrate to form a first gate oxide layer in the logic region.

In one embodiment, the method may also include the steps of performing at least one oxide deposition process step in the ALD chamber to concurrently add thickness to the blocking oxide layer and the first gate oxide layer in the logic region.

In one embodiment, the process parameters of the one or more silicon nitride deposition process steps may include the types of silicon source pre-cursor gas including HCD, the types of reactant gas including $NH_3/N_2O$ gas, flowrate of the reactant gas and silicon source pre-cursor gas, reaction time for each of the reactant gas and silicon source pre-cursor gas, and sequence of the reactant gas and silicon source pre-cursor gas entering the ALD chamber.

In one embodiment, the process parameters of the one or more silicon nitride deposition process steps may be adjusted to produce the CT sub-layers having at least one of different thickness, density, and film composition of Si, O, and N of silicon nitride in the CT sub-layers.

According to one embodiment of a method of fabrication of a SONOS based memory device, the method may include the steps of forming a memory cell including a SONOS transistor and a pass transistor in a memory region of a substrate, including the steps of forming a tunnel oxide layer in the memory region and a logic region of the substrate, forming a customizable charge trapping (CT) layer and a cap layer overlying the tunnel oxide layer, wherein the customizable CT layer includes multiple CT sub-layers, and wherein each of the CT sub-layers is formed by one or more silicon nitride deposition process step performed in an atomic layer deposition (ALD) chamber, patterning the tunnel oxide, customizable CT, and cap layers to form a memory stack in the memory region while removing those layers in the logic region, and forming a blocking oxide layer overlying the customizable CT layer and a first gate oxide of the pass transistor in the memory region, and forming a high voltage (HV) gate oxide layer of a HV transistor, an input/output (I/O) gate oxide layer of an I/O transistor, and a low voltage (LV) gate oxide layer of a LV transistor in the logic region. In one embodiment, at least one of the HV, I/O, and LV gate oxides are formed at least partly by performing at least one radical oxidation process step in the ALD chamber to concurrently convert silicon nitride in at least the cap layer to form the blocking oxide layer and silicon to form the first gate oxide in the memory region, and convert silicon in the substrate to form at least partly the at least one of the HV, I/O, and LV gate oxides in the logic region.

In one embodiment, the method may also include the steps of performing at least one oxide deposition process step in the ALD chamber to concurrently add thickness to the blocking oxide layer and the first gate oxide layer in the memory region.

In one embodiment, the pass transistor and the HV transistor may be of the same type, and wherein the first gate oxide and the HV gate oxide are formed concurrently and have approximately the same thickness.

In one embodiment, the process parameters of the one or more silicon nitride deposition process steps may be adjusted to produce the CT sub-layers having different film compositions of Si, O, and N of silicon nitride in the CT sub-layers, and wherein a top CT sub-layer is the most oxygen-lean and a bottom CT sub-layer is the most oxygen-rich in the customizable CT layer.

In one embodiment, the oxide deposition process steps, the radical oxidation process steps, and the silicon nitride deposition process steps are performed in situ in the ALD chamber and process temperatures are controlled at below 650° C.

In one embodiment, the method may also include the steps of forming high-K metal gates (HKMG) overlying the blocking oxide of the SONOS transistor and the first gate oxide layer of the pass transistor.

DESCRIPTION OF EMBODIMENTS

FIG. 1 is a block diagram illustrating a cross-sectional side view of a SONOS based NVM device. In one embodiment, illustrated in FIG. 1, the NVM transistor 100 is a SONOS-type charge trapping NVM transistor that may be configured to store a binary value ("0" or "1") or a multi-level analog value (e.g. $0$-$2^n$-$1$) corresponding to the amount and polarity of trapped charges it retains. Referring to FIG. 1, NVM cell 90 includes a memory gate (MG) stack 150 formed over substrate 102. NVM transistor 100 further includes source/drain regions 104 formed in substrate 102, or optionally within shallow positive well (SPW—not shown) in substrate 102, on either side of MG stack 150. SPW may be at least partly encapsulated within deep negative well (DNW—not shown). In one embodiment, source/drain regions 104 are connected by channel region 116 underneath MG stack 150. NVM transistor 100 includes a tunnel dielectric layer 106, a charge trapping layer 108, a blocking dielectric layer 110, forming an ONO stack 120. In one embodiment, charge trapping layer 108 may be multiple layered and traps charges injected from substrate 102 by FN tunneling or other mechanism. $V_T$ and $I_D$ values of NVM transistor 100 may change at least partly due to the amount and polarity of trapped charges. In one embodiment, a high K dielectric layer may form at least a portion of the blocking dielectric layer 110. A poly-silicon (poly) or metal gate layer 112 disposed overlying the ONO stack 120, which may serve as a control gate (CG) or memory gate (MG). NVM transistor 100 also may also include spacers 114 to provide electrical insulation to adjacent or other devices.

In various embodiments, ONO stack 120 may be formed by a series of oxidation (both thermal and/or radical and/or others), deposition (physical, chemical, etc.), etching, and/or cleaning process steps. The process steps may be carried out in a single process chamber/tool or multiple process chambers/tools. In some embodiments, current ONO process limits the compositional changes that can be achieved in thin layers of the SONOS stack, which are essential in advanced technology nodes, such as 22 nm or below. Current ONO formation process/tools may also suffer from marginality for uniformity of film stoichiometry and thickness, such as wafer-to-wafer (WTW) thicknesses and within wafer (WIW) thicknesses. This may adversely affect quality of the ONO stack and productivity by limiting batch size to 50 or so wafers and reducing fabrication plants' capacity for relating products. In advanced technology nodes, the thermal budget of certain ONO processes may be too high, for example in-situ steam generation (ISSG) oxidation, furnace dry or wet oxidation, chemical vapor deposition of oxide and nitride, etc. The high thermal budget for these processes may be significant enough to shift baseline CMOS device parameters which in turn may need changes in models of baseline FETs.

Figure 2A:
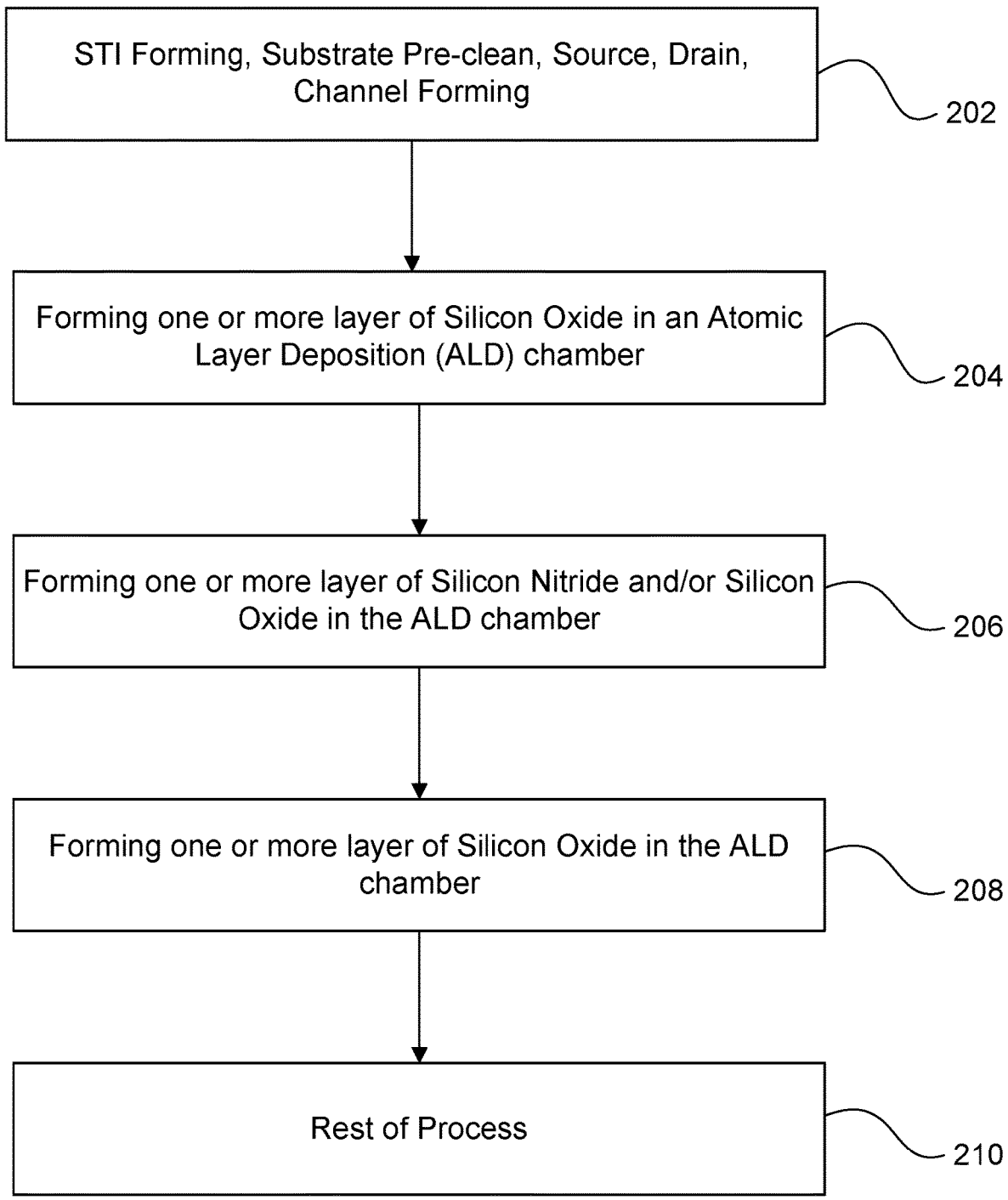
FIG. 2A is a representative flowchart illustrating an embodiment of a method of fabrication of an oxide-nitride-oxide (ONO) stack in a SONOS based non-volatile memory transistor according to an embodiment of the present disclosure.
Figure 3A:
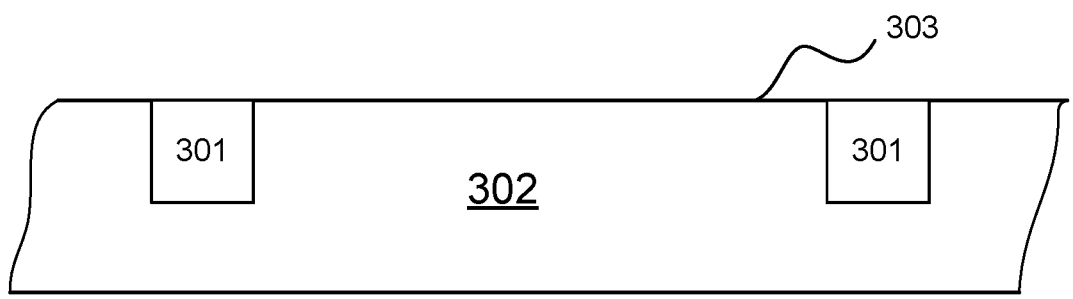
FIG. 3A-3D are representative diagrams illustrating cross-sectional views of a tunnel dielectric portion of a SONOS based non-volatile memory transistor during fabrication according to the method of FIG. 2A.

FIG. 2A is representative flowchart illustrating an embodiment of a method of fabrication of an oxide-nitride-oxide (ONO) stack in a SONOS based non-volatile memory transistor, such as NVM transistor 100 in FIG. 1, according to an embodiment of the present disclosure. Referring to FIG. 2A and FIG. 3A, the process may begin with a series of pre-steps (step 202) including forming a number of isolation structures or shallow trench isolations (STIs) 301 in a wafer or substrate 302. In some embodiments, pre-steps may also include forming channel(s) such as channel 116 in FIG. 1, source/drain 104 in FIG. 1, and/or deep wells and/or wells. Various processes including pad oxide forming, wet/dry etching or cleaning, tunnel mask application, and dopants implant may be performed according to the practice of ordinary skill in the art. It will be the understanding that none or some of the aforementioned pre-steps or other pre-steps may be performed before tunnel dielectric layer is formed. Subsequently, a preclean process is performed on the substrate surface 303 to remove pad oxide (if present) and/or other residual oxide, which may be a wet or dry process. In one embodiment, it may be a wet process using HF followed by standard cleans (SC1) and (SC2), and is highly selective to the material of substrate 302.

Figure 2B:
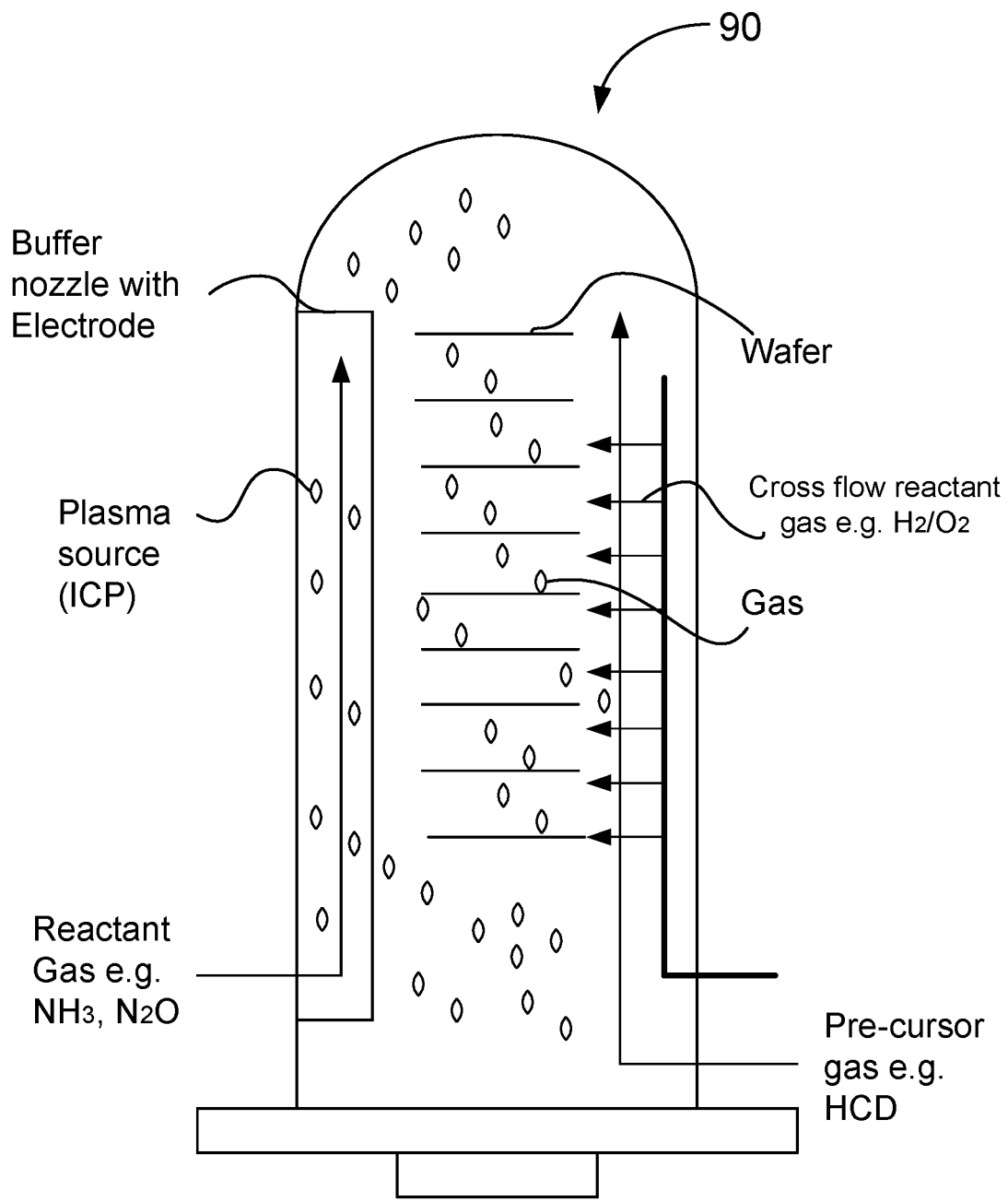
FIG. 2B is a representative diagram illustrating an example of atomic layer deposition (ALD) chamber or tool.
Figure 3B:
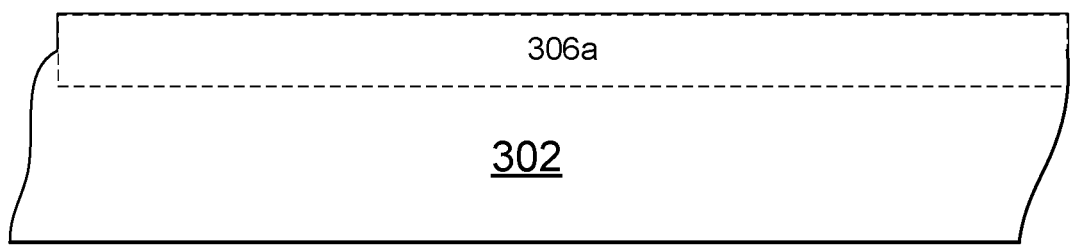

Referring to FIGS. 2 and 3B, the ONO layer such as ONO stack 120 as best shown in FIG. 1 begins with the formation of tunnel dielectric in step 204. The tunnel dielectric may be any material and have any thickness suitable to allow charge carriers to tunnel into an overlying charge trapping layer under an applied gate bias while maintaining a suitable barrier to leakage when the transistor is unbiased. In certain embodiments, tunnel dielectric may be silicon dioxide, silicon nitride such as oxynitride, or a combination thereof and may be deposited and/or grown by a thermal oxidation process in a furnace, using ISSG or radical oxidation. As previously discussed, it is a challenge to form a very thin (e.g. less than 20 Å) tunnel dielectric layer with uniformity of film stoichiometry and WTW/WIW thicknesses, while under a thermal budget of under 650° C. using the aforementioned processes. In one embodiment, as may be referred to as a preferred embodiment, a multi-layer silicon oxide tunnel dielectric layer 306 may be formed in a single in-situ atomic layer deposition (ALD) chamber that is capable of radical oxidation, thermal ALD or plasma-enhanced ALD (PEALD), using either a batch or single tool. In one embodiment, both radical oxidation and ALD deposition process may be performed in the same ALD chamber. The sequential, self-limiting surface reaction characteristics of ALD deposition and radical oxidation facilitate film thickness and uniformity control with atomic-scale precision at a relatively low thermal budget (such as below 650° C.). Referring to FIG. 2B, an example of an ALD chamber or tool 90 is illustrated. The ALD chamber 90 may be a batch tool in which multiple wafers (substrate) may be processed concurrently. Precursor gas, such as HCD as silicon source may be introduced. Other reactant gases, such as ammonia or nitrous oxide may be enhanced by plasma source, such as inductively coupled plasma (ICP) before entering the chamber through a buffer nozzle with electrode. Other reactant gases such as $H_2/O_2$ may be introduced by cross flow injector. It will be the understanding that the ALD chamber 90 best shown in FIG. 2B is merely an example of ALD tools that are capable of radical oxidation, thermal ALD and PEALD processes, and should not be construed as limitations. Other ALD tools that are capable of performing the radical oxidation and ALD deposition disclosed in this patent document may be used according to the fabrication requirements and other concerns.

Referring to FIG. 3B, in one embodiment, tunnel dielectric sub-layer 306a is formed by radical oxidation in the ALD chamber. The process involves flowing reactants hydrogen ($H_2$) and oxygen ($O_2$) gas into the ALD chamber at a ratio to one another of approximately 1:4 or other configurable ratios without an external ignition event, such as forming of a plasma. The $H_2$ and $O_2$ are permitted to react at a temperature approximately in the range of about 300° C. to about 650° C. at a pressure approximately in the range of about 0.5 Torr to about 10 Torr to form radicals, such as, an OH radical, an $HO_2$ radical or an O diradical, at the surface of substrate 302 and eventually react directly with and consume a portion of the exposed surface of silicon substrate 302. In one embodiment, an example process/operation table for performing radical oxidation in the ALD chamber as follow:

TABLE 1

| Gas | Flow (sccm) | Time (sec.) |
|---|---|---|
| $N_2$ | 1000 | 4 |
| $O_2$ | 4000 | 3 |

TABLE 1-continued

| Gas | Flow (sccm) | Time (sec.) |
|---|---|---|
| $H_2/O_2$ | 900/4000 | 60 |
| $O_2$ | 4000 | 3 |
| $N_2$ | 1000 | 4 |

Thickness, quality, and uniformity of the formed tunnel dielectric sub-layer 306a may be fine-tuned or tailor made by modifying or adjusting the process gas sequence, flow rate, sequence, time duration, temperature, gas flow ratios, or other process parameters according to requirements of the device fabricated.

Figure 3C:
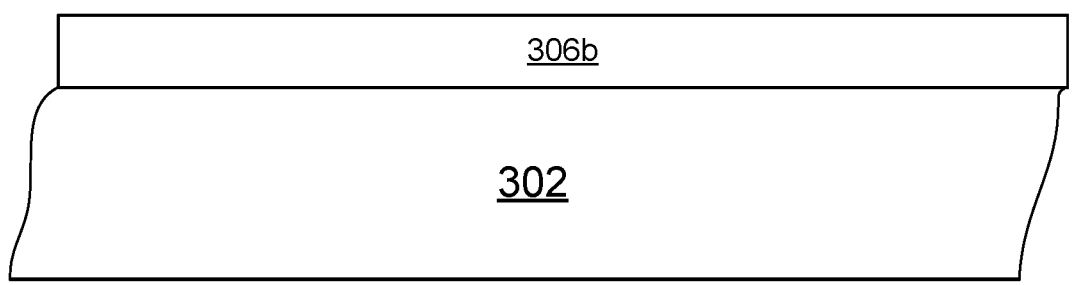

Referring to FIG. 3C, tunnel dielectric sub-layer 306b may also be formed using a deposition workflow in the same or a similar ALD chamber. In one embodiment, chlorosilane such as hexachlorodisilane $Si_2Cl_6$ (HCD) may be the precursor or silicon source gas. Hydrogen ($H_2$) and oxygen ($O_2$) gas is flown into the ALD chamber at a ratio to one another of approximately 1:4 without an external ignition event, such as forming of a plasma. The $H_2$ and $O_2$ are permitted to react at a temperature approximately in the range of about 300° C. to about 400° C. at a pressure approximately in the range of about 0.5 Torr to about 10 Torr to form radicals, such as, an OH radical, an $HO_2$ radical or an O diradical, eventually react with HCD to form the deposited silicon oxide over the surface of substrate 302. During the same process, radicals generated may also react directly with the silicon substrate 302 to form silicon oxide, as in the previously explained radical oxidation. In one embodiment, an example process/operation table for performing silicon oxide deposition in the ALD chamber as follow:

TABLE 2

| Gas | Flow (sccm | Time (sec.) |
|---|---|---|
| HCD | 200 | 3 |
| $N_2$ | 1000 | 4 |
| $O_2$ | 4000 | 3 |
| $H_2/O_2$ | 900/4000 | 4 |
| $O_2$ | 4000 | 3 |
| $N_2$ | 1000 | 4 |

Like the radical oxidation, thickness, quality, and uniformity of the formed tunnel dielectric sub-layer 306b may be fine-tuned or tailor made by modifying the process gas sequence, flow rate, time duration, temperature, gas flow ratios, or other process parameters according to requirements of the device fabricated. In one embodiment, tunnel dielectric layer 306a and 306b produced in a radical oxidation process or an ALD deposition process may be both denser and composed of substantially fewer hydrogen atoms per $cm^3$ than a tunnel dielectric otherwise formed by wet oxidation techniques, even at a reduced thickness. The uniform thickness of tunnel dielectric layer 306, especially around the STI corner, may reduce the non-uniformity of FN injection in the STI 301 corner of the eventual SONOS device will lead to lower sigma of $I_D$ or $V_T$.

Figure 3D:
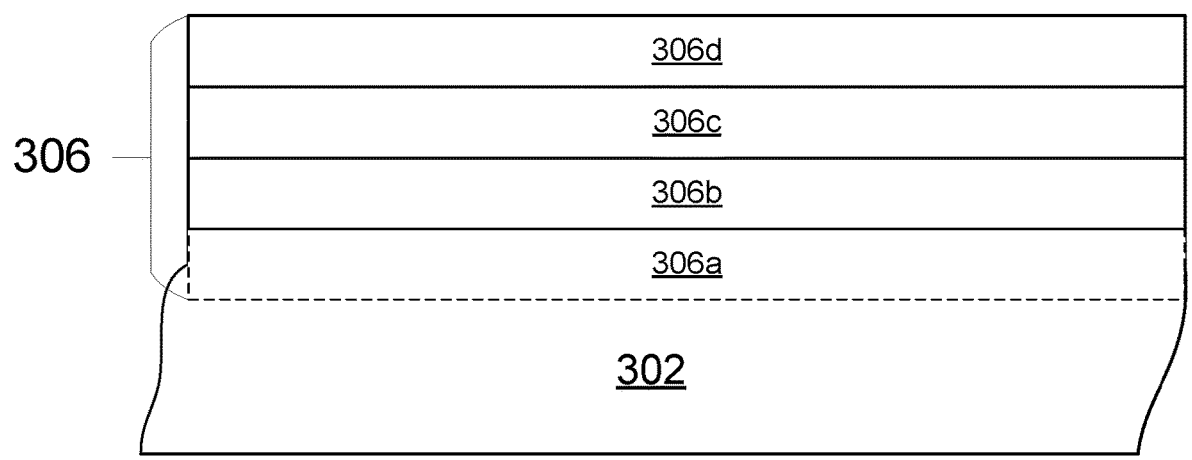

In embodiments, radical oxidation, such as described in Table 1 and ALD oxide deposition, such as described in Table 2 may be individually repeated with or without modification in process parameters, alternatively repeated with or without modification in process parameters, a combination thereof, or in any designated sequence to produce multiple tunnel dielectric sub-layers 306a-306d. Each sub-layer may be formed by one or more radical oxidation process step alone (e.g. as in Table 1 or modifications), one or more ALD oxide deposition step alone (as in Table 2 or modifications), or a combination thereof until a pre-determined thickness is achieved; and each sub-layer may be formed down to a thickness of 2 Å or below. The final tunnel dielectric layer 306 is a stacking of the multiple tunnel dielectric sub-layers 306a-306d, as best shown in FIG. 3D. By controlling and adjusting the process parameters, such as flow rate, reactants, time duration, temperature, etc. in the radical oxidation process steps and ALD deposition process steps, a tunnel dielectric layer 306 with customizable and desirable thickness (WTW and WIW), uniformity, oxide-silicon substrate interface conditions, film stoichiometry may be achieved. It will be the understanding that the 4 sub-layer tunnel dielectric layer 306 shown in FIG. 3D is merely an example to illustrate the proposed ALD oxidation/deposition method and should not be interpreted as a restriction. Tunnel dielectric layer 306 may have one or multiple sub-layers and each sub-layer may have different thicknesses, film stoichiometry, density, or other physical and chemical characteristics by finetuning the ALD radical oxidation and deposition process steps. In one embodiment, tunnel dielectric layer 306 may be formed to a thickness in an approximate range of 5 Å-30 Å.

Figure 4A:
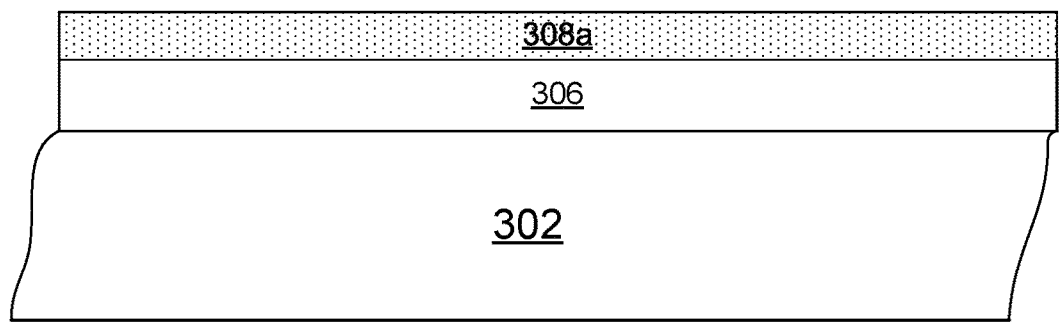
FIG. 4A-4E are representative diagrams illustrating cross-sectional views of a charge trapping dielectric portion of a SONOS based non-volatile memory transistor during fabrication according to the method of FIG. 2A.

Referring to FIG. 2, a multi-layer silicon nitride or oxynitride ($Si_xO_yN_z$) charge trapping layer may be formed in the same ALD chamber in step 204. In embodiments, silicon nitride or oxynitride may possess different ratios of silicon (x), oxygen (y), and nitrogen (z) in the film formed. The charge trapping layer may be composed of a material and have a thickness suitable to store charge and, hence, change the threshold voltage of a subsequently formed SONOS device. Referring to FIG. 4A, charge trapping dielectric sub-layer 308a is formed in the same or a similar in-situ ALD chamber for the tunnel dielectric layer 306. In one embodiment, the process involves flowing precursor gas HCD as silicon source, ammonia ($NH_3$) as nitrogen source, and nitrous oxide ($N_2O$) as oxygen source. In other embodiments, other chlorosilane gas may be used as silicon source and other nitrogen or oxygen source gas may be used according to the practice of ordinary skill in the art. In yet another embodiment, ammonia gas or nitrous oxide gas may be plasma enhanced prior to introduction to the ALD chamber, for potential higher silicon nitride deposition rate and better uniformity at low temperature. In one embodiment, the ALD deposition process of silicon nitride is carried out under 650° C., which is lower than most thermal process and chemical vapor deposition processes. In one embodiment, a layer of silicon nitride down to 2 Å may be formed in the ALD chamber. An example process/operation table for performing silicon nitride deposition in the ALD chamber as follow:

TABLE 3

| Gas | Flow (sccm) | Time (sec.) |
|---|---|---|
| HCD | 232 or 200 or 196 | 3 |
| $N_2$ | 1000 | 4 |
| $NH_3/N_2O$ | 18/64 or 18/100 or 98/14 | 3 |
| $N_2$ | 1000 | 4 |

Figure 4B:
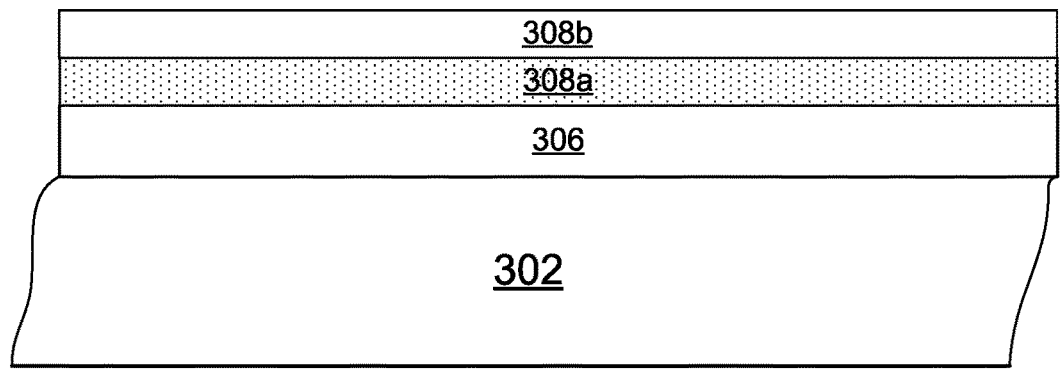
Figure 4C:
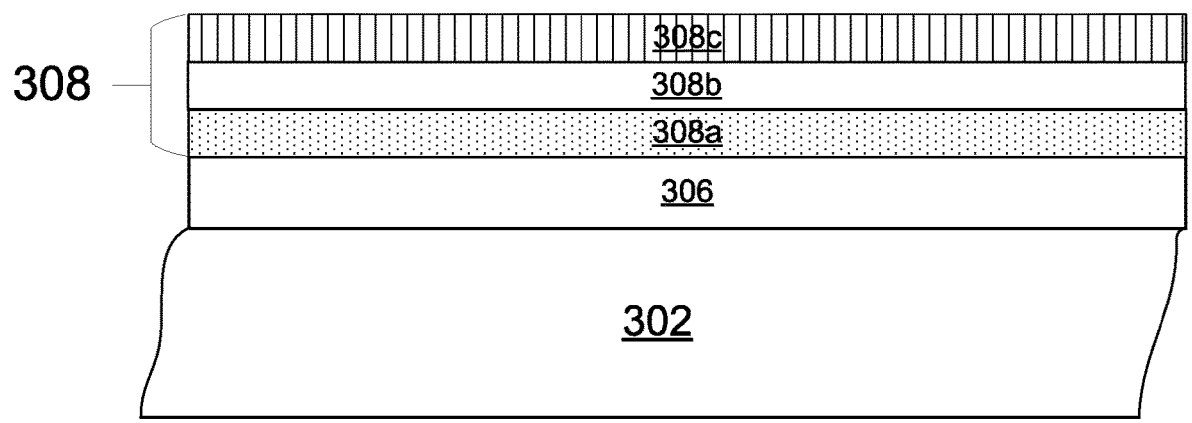

Similar to the previously described silicon oxide ALD process, thickness, uniformity, ratio of oxygen, nitrogen and/or silicon in silicon nitride formed may be tailor made to produce a customizable charge trapping dielectric sub-layer 308a. In one embodiment, the silicon nitride ALD process may leave the already formed tunnel dielectric layer 306 largely unaffected. Referring to FIG. 4B, another charge trapping dielectric sub-layer 308b may be formed over charge trapping dielectric sub-layer 308a. In one embodiment, charge trapping dielectric sub-layer 308b may be formed in the same ALD chamber using process parameters as described in Table 3, or any modified process parameters. For example, flowrate and/or flow time of $N_2O$ gas may be increased to produce an oxygen-rich nitride layer, or the same for HCD gas and ammonia gas may be adjusted or otherwise increased or decreased to produce a silicon-rich nitride layer and a nitrogen-rich nitride layer, respectively. Referring to FIG. 4C, yet another charge trapping dielectric sub-layer 308c may be formed over charge trapping dielectric sub-layer 308b, using a similar ALD deposition process as described in Table 3, with or without modification of the process parameters. In one embodiment, charge trapping dielectric sub-layers 308a-308c may collectively form charge trapping dielectric layer 308 for the finished SONOS device. It will be the understanding that the three-layer charge trapping dielectric layer 308 shown in FIG. 4C is merely an example to illustrate the proposed ALD deposition of silicon nitride method and should not be interpreted as a restriction. Charge trapping dielectric layer 308 may have one or multiple sub-layers and each sub-layer may have different thicknesses, film composition of Si, O, and N in the silicon nitride, or other physical and chemical characteristics by finetuning the ALD deposition process. In one embodiment, charge trapping dielectric layer 308 may be a multi-layer silicon nitride having an ascending oxygen richness gradient from the top, in which the top sub-layer 308c is the least oxygen-rich silicon nitride sub-layer while the bottom sub-layer 308a the most oxygen-rich.

As used herein, the terms "oxygen-rich" and "silicon-rich" are relative to a stoichiometric silicon nitride, commonly employed in the art having a composition of ($Si_3N_4$) and with a refractive index (RI) of approximately 2.0. Thus, "oxygen-rich" silicon nitride entails a shift from stoichiometric silicon nitride or sometimes referred to as silicon nitride or oxynitride (silicon nitride that contains oxygen) toward a higher weight % of silicon and oxygen (i.e. reduction of nitrogen). An oxygen rich silicon nitride or oxynitride film is therefore more like silicon dioxide and the RI is reduced toward the 1.45 RI of pure silicon dioxide. Similarly, films described herein as "silicon-rich" entail a shift from stoichiometric silicon nitride toward a higher weight % of silicon with less oxygen than an "oxygen-rich" film. A silicon-rich silicon nitride film is therefore more like silicon and the RI is increased toward the 3.5 RI of pure silicon. Throughout this document, "silicon nitride" and "silicon oxynitride" would be used interchangeably and the film formed may or may not have oxygen content.

In one embodiment, it may be desirable to produce a charge trapping dielectric film in which a majority of charge traps are distributed in the upper portion of the film. It may minimize charge leakage through the tunnel dielectric layer underneath. Using charge trapping dielectric layer 308 in FIG. 4C as an example, process parameters during ALD deposition of charge trapping dielectric sub-layer 308a may be configured to produce an oxygen-rich, nitrogen-lean silicon nitride film. Using the same ALD chamber with adjustment of process parameters, charge trapping dielectric sub-layer 308c may be formed an oxygen-lean, nitrogen-rich silicon nitride film that contain a majority of charge traps in the entire multi-layer charge trapping dielectric layer 308.

Figure 4D:
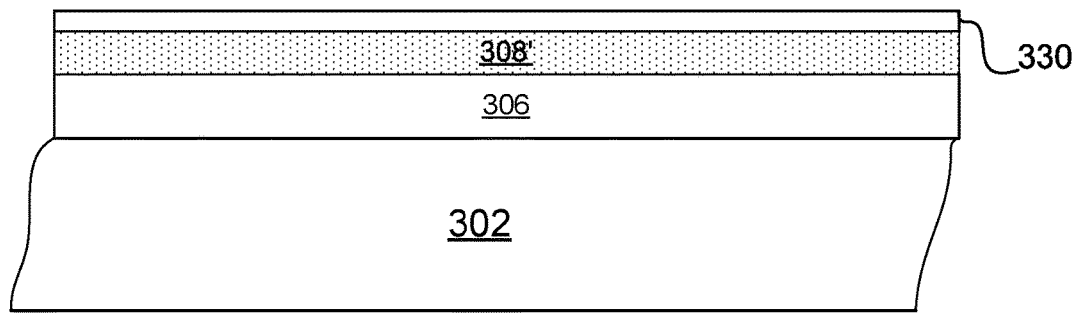

In some embodiments, a thin silicon oxide film may be formed within a charge trapping nitride layer, sandwiched between two nitride layers. Referring to FIG. 4D, a thin dielectric film 330 may be formed over lower charge trapping dielectric layer 308'. Lower charge trapping dielectric layer 308' is one or more sub-layers of silicon nitride formed similarly as charge trapping dielectric layer 308. The thin dielectric film 330 may be silicon oxide or very oxygen-rich silicon nitride, and may be formed using ALD radical oxidation or ALD oxide deposition similar to the aforementioned tunnel dielectric sub-layer 306a-306d formation. Silicon oxide is either directly deposited over lower charge trapping dielectric layer 308' or radicals may convert a portion of silicon nitride in the lower charge trapping dielectric layer 308' to silicon oxide or very oxygen rich nitride. In embodiments, thin dielectric film may be a single layer or has multiple sub-layers and each sub-layer is formed using the aforementioned ALD radical oxidation or oxide deposition process steps in the same ALD chamber.

Figure 4E:
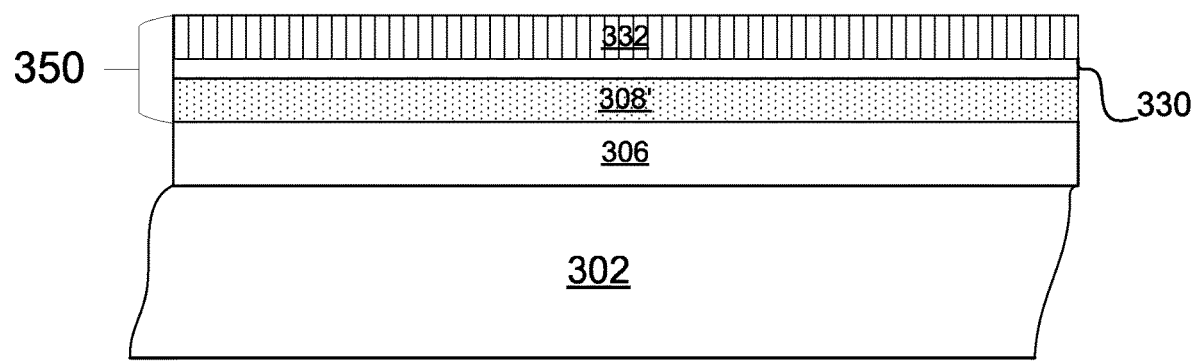

Referring to FIG. 4E, subsequently upper charge trapping dielectric layer 332 is formed over the thin dielectric film 330, making the finished charge trapping dielectric layer 350 a nitride (332)-oxide (330)-nitride (308') (lower) (N—O—N) stack 350 having a total thickness in an approximate range of 50 Å-150 Å. In one embodiment, similar to lower charge trapping dielectric layer 308', upper charge trapping dielectric layer 332 includes one or more sub-layers (not shown) of silicon nitride formed similarly as charge trapping dielectric sub-layers 308a-308c. Upper charge trapping dielectric layer 332 is also customizable; and each sub-layer of silicon nitride therein may have different thicknesses, film ratio of Si, O, N in silicon nitride formed, or other physical and chemical characteristics by finetuning the ALD deposition process. In one embodiment, the thin dielectric film 330 substantially reduces the probability of electron charge that accumulates at the boundaries of the upper charge trapping layer 332 during programming from tunneling into the lower charge trapping layer 308', resulting in lower leakage current than for the conventional memory devices. In one preferred embodiment, sub-layers of nitride in upper charge trapping dielectric layer 332 may be customized to be oxygen-lean to contain a majority of the charge traps while sub-layers of nitride in lower charge trapping dielectric layer 308' oxygen-rich.

Figure 5A:
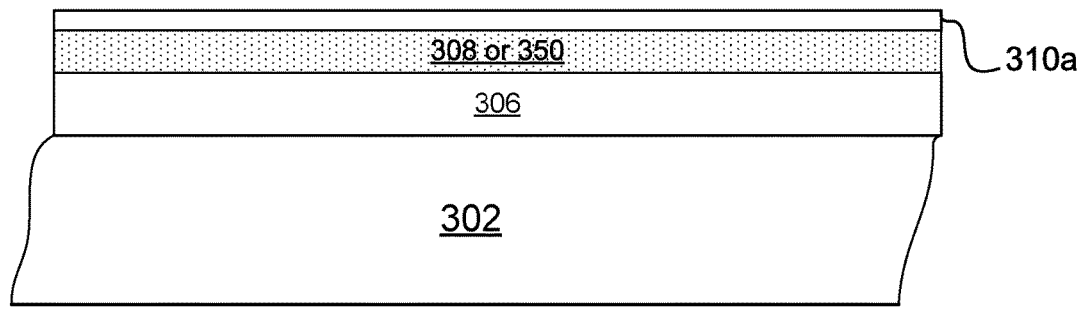
FIG. 5A-5D are representative diagrams illustrating cross-sectional views of a top or blocking dielectric portion of a SONOS based non-volatile memory transistor during fabrication according to the method of FIG. 2A.
Figure 5B:
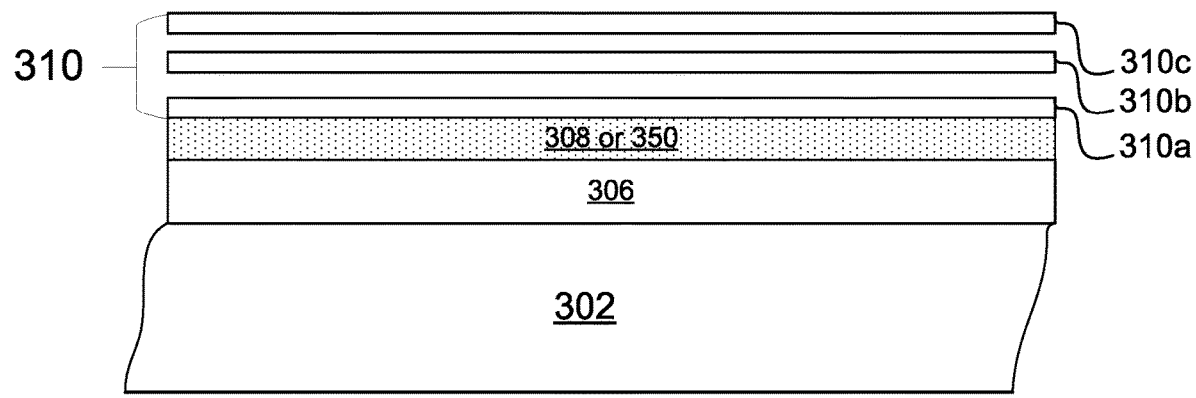
Figure 5C:
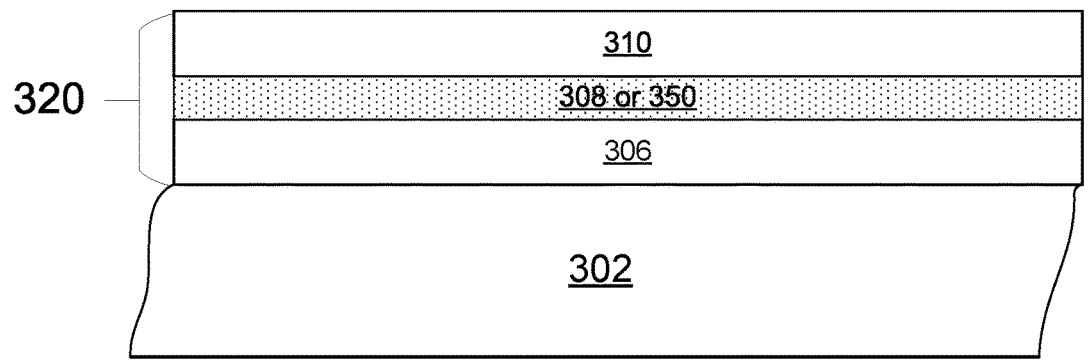
Figure 5D:
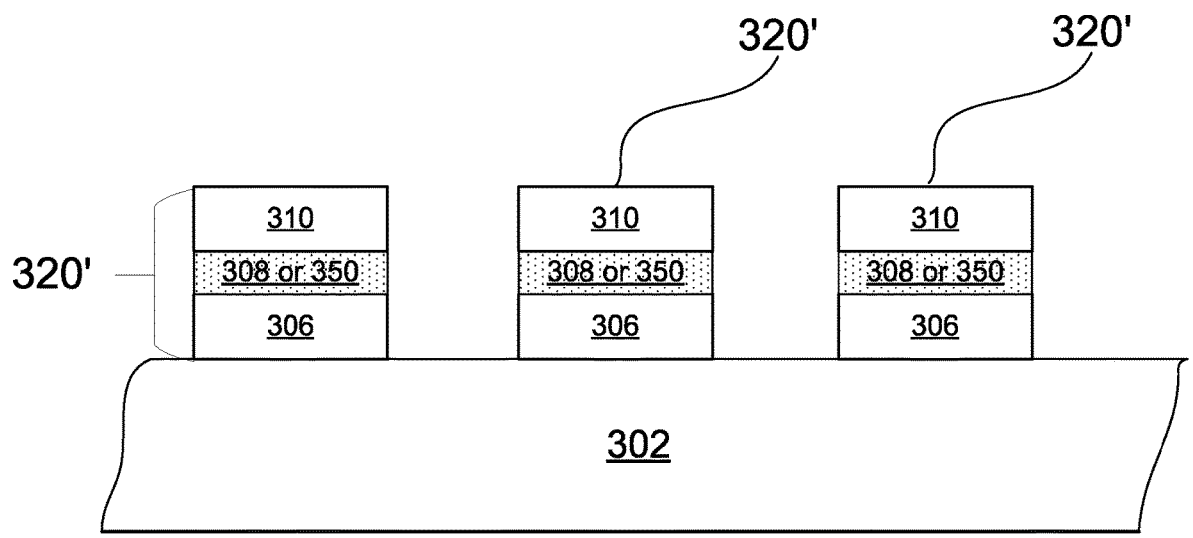

Referring to FIGS. 2, blocking dielectric layer 310 is formed over charge trapping dielectric layer 308 or NON charge trapping dielectric layer 350, in step 208. The process begins with formation of blocking dielectric sub-layer 310a over charge trapping dielectric layer 308 or 350. In one embodiment, blocking dielectric sub-layer 310a is silicon oxide and formed by radical oxidation as described earlier in Table 1 or ALD oxide deposition as described in Table 2, or modifications, combinations, and variations thereof. Silicon oxide is either deposited over charge trapping dielectric layer 308 or 350, or radicals may convert a portion of the silicon oxynitride in charge trapping dielectric layer 308 or 350 into silicon oxide. Referring to FIG. 5B, other blocking dielectric sub-layers 310b-310c may be formed subsequently. In one embodiment, blocking dielectric sub-layers 310b-310c may be formed by similar radical oxidation or ALD oxide deposition into silicon oxide film with customizable thicknesses, uniformity, and quality by modifying the processes performed in the ALD chamber. Consequently, blocking dielectric layer 332 may be a single or multilayer silicon oxide having a total thickness in an approximate range of 10 Å-100 Å. Referring to FIG. 5C, ONO stack layer 320 is then formed over at least a portion of substrate 302, all in the same in-situ ALD tool. Referring to FIG. 5D, in one embodiment, ONO stack layer 320 may be patterned to form one or multiple ONO stack(s) 320' for SONOS based transistor(s), similar to ONO stack 120 of NVM transistor 100 in FIG. 1. A mask may be formed on or overlying the ONO stack layer 320, and the ONO stack layer 320 is etched to form one or more ONO stack(s) 320' overlying substrate 302. The fabrication process may proceed with the rest of process, in step 210. Process steps such as source/drain forming, spacers forming, memory gate forming, etc. according to the practice of ordinary skill in the art will be carried out. It will be the understanding that the aforementioned process steps may take place before, in-between, or after ONO stack layer 320 formation (in steps 204-208) without deviating from the principle of the present disclosure.

Figure 5E:
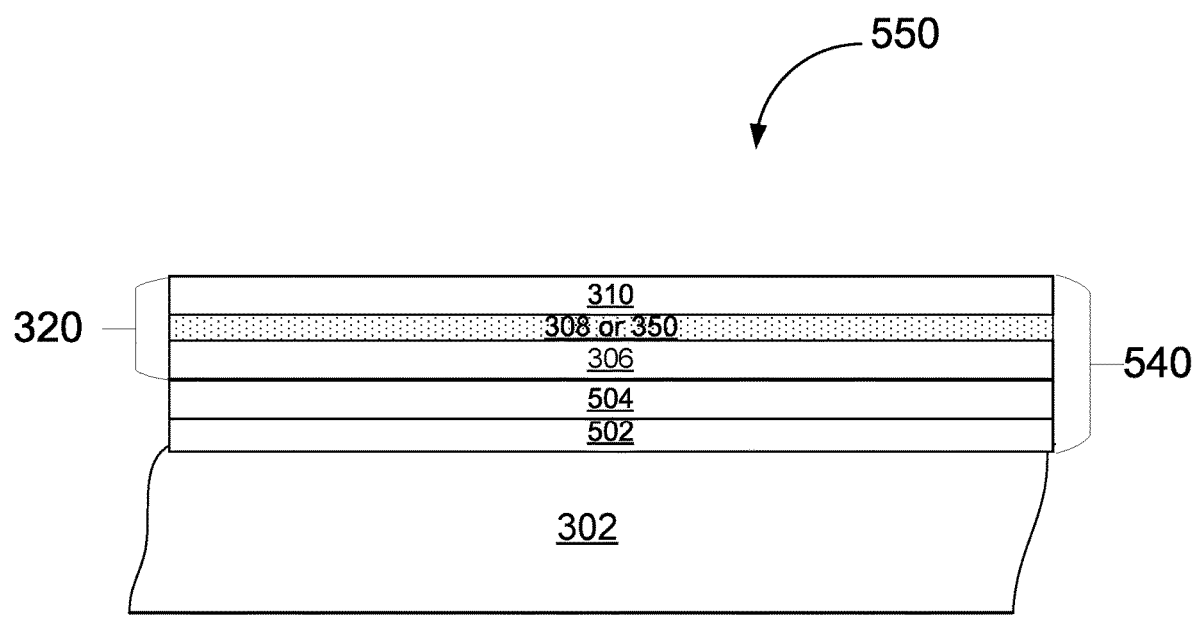
FIG. 5E is a representative diagram illustrating cross-sectional view of a memory stack of a floating gate memory transistor including an ONO blocking dielectric stack according to an embodiment of the present disclosure.

In one alternative embodiment, referring to FIG. 5E, instead of being the ONO stack of a SONOS based transistor and being formed directly over substrate 302, ONO stack layer 320 may be formed as a part of a memory stack layer 540 of a floating gate transistor 550. In one embodiment, ONO stack layer 320, which as a whole performs as the blocking dielectric layer of the floating gate transistor 550, is formed over tunnel oxide layer 502 and floating gate layer 504. Tunnel oxide layer 502 which is primarily silicon oxide and floating gate layer 504 which may be polycrystalline silicon may be formed within the same ALD chamber as the ONO stack layer 320, or formed using other techniques that are practiced by one having ordinary skill in the art.

Figure 6:
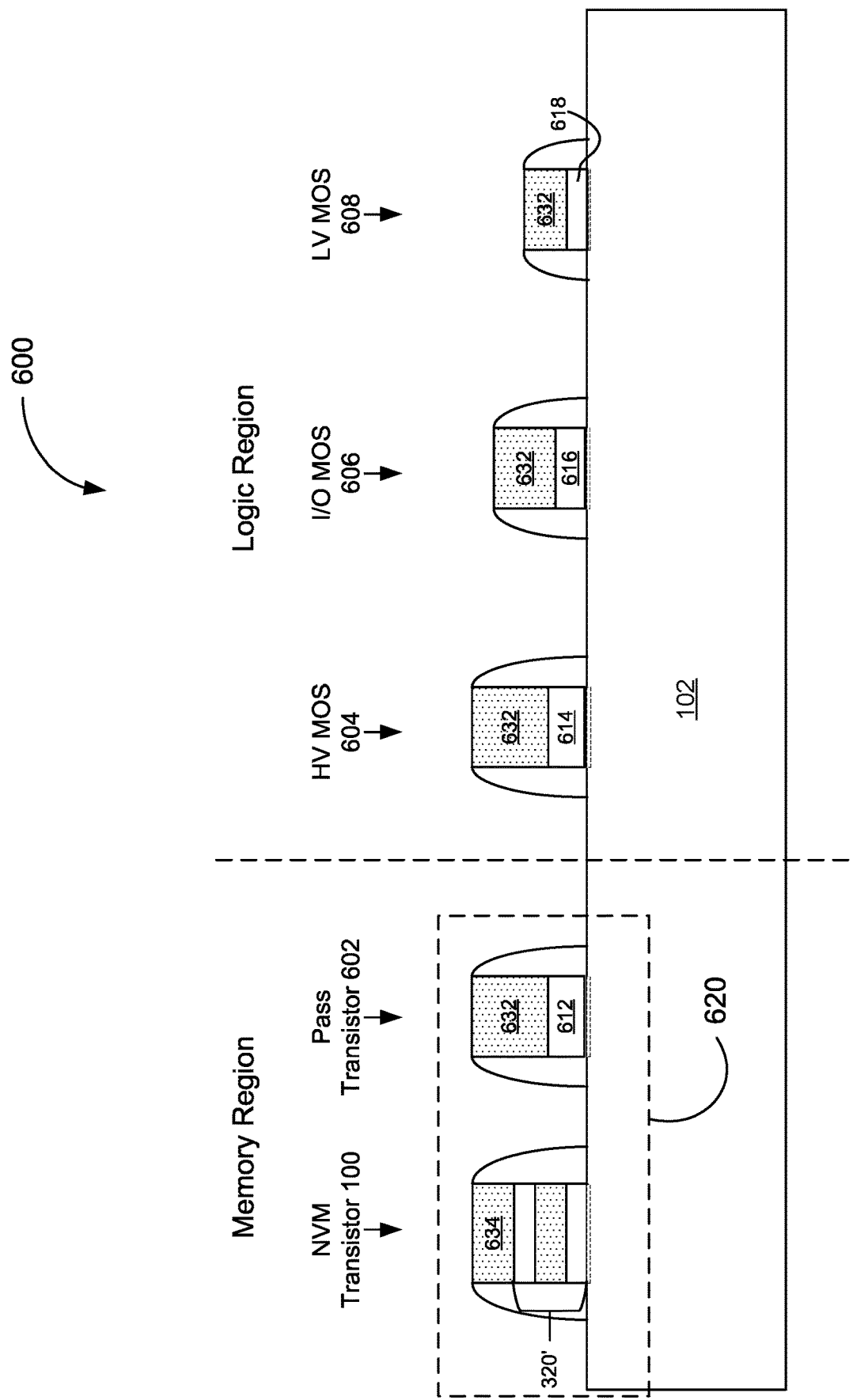
FIG. 6 is a block diagram illustrating a cross-sectional side view of a portion of SONOS based non-volatile memory cell(s) or device according to an embodiment of the present disclosure.

Referring to FIG. 6, a portion of a SONOS based non-volatile memory (NVM) device 600 formed over a single substrate 102 is illustrated. In one embodiment, substrate 102 is divided into a memory region where memory cells 620 are disposed and a logic region where HV MOS 604, I/O MOS 606, and LV MOS 608 are disposed. In one embodiment, only a single device of each type (i.e. memory cell 620, HV MOS 604, I/O MOS 606, and LV MOS 608) are shown solely for illustration purposes. Multiple devices of each type and other semiconductor devices may be disposed within the SONOS based NVM device 600 and may be formed concurrently or sequentially. As best shown in FIG. 6, NVM transistor 100 may have a poly-silicon (poly) or hi-K metal gate (HKMG) layer 634 disposed overlying ONO stack 320', which may serve as a control gate (CG) or memory gate (MG) of memory cell 620.

As best shown in FIG. 6, in a two-transistor (2T) configuration, memory cell 620 further includes a pass transistor or select transistor 602 disposed adjacent to a SONOS based NVM transistor 100 (or referred to as a memory transistor). Pass transistor 602, for example, a conventional MOSFET sharing a common substrate connection, or internal node, with the NVM transistor 100. In one embodiment, pass transistor 102 includes a Hi-K metal gate (HKMG) or polysilicon select gate (collectively as "SG") 632 disposed overlying an oxide or high-K dielectric gate dielectric layer 612. SG 632 is appropriately biased to open or close the channel underneath pass transistor 602. In another embodiment, memory cell 620 may adopt a one-transistor (1T) configuration and only have NVM transistor 100.

Referring to FIG. 6, in the logic region, HV MOS, I/O MOS, and LV MOS transistors 604, 606, 608 are field-effect transistors (FETs) having a logic gate 632 that is either a HKMG gate or a polysilicon gate formed overlying HV gate oxide 614, I/O gate oxide 606, and LV gate oxide 618, respectively. In one embodiment, HV gate oxide 614 has the greatest thickness, followed by I/O gate oxide 616, and followed by LV gate oxide 618. In one embodiment, pass transistor 602 in the memory region may have a similar or same structure and dimension as one of the HV MOS, I/O MOS, and LV MOS transistors 604, 606, 608.

Figure 7:
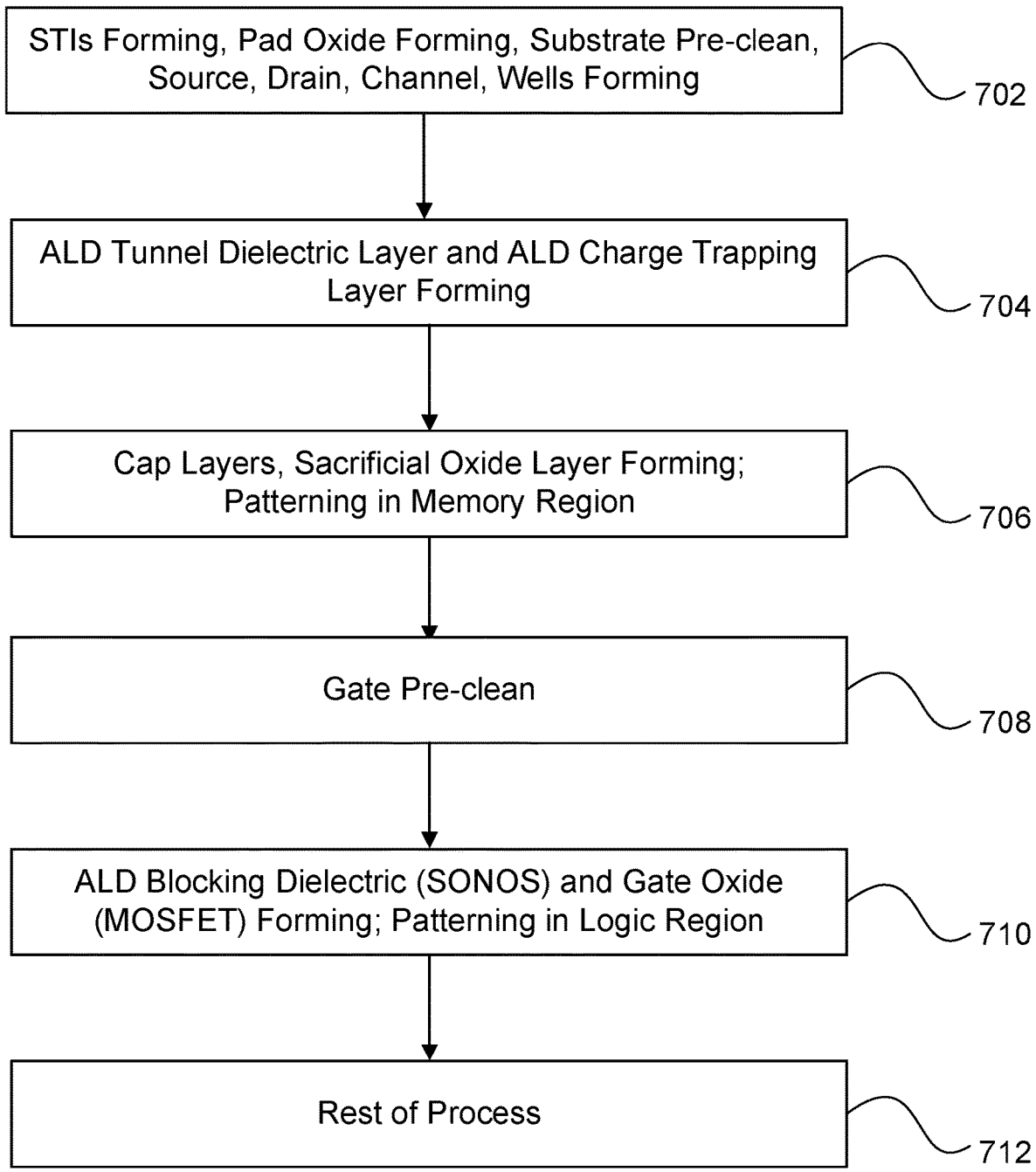
FIG. 7 is a representative flowchart illustrating an embodiment of a method of fabrication for SONOS based memory transistors integration into MOS transistors process flow according to an embodiment of the present disclosure.

FIG. 7 is a process flowchart illustrating key fabrication steps of integrating SONOS or NVM transistors (in the memory region) into a baseline complementary metal oxide semiconductor (CMOS) process flow (in the logic region) in accordance with one embodiment of the present disclosure. Referring to FIG. 7, the process begins with a number of pre-steps including forming a number of isolation structures or shallow trench isolations (STIs), pad oxide forming, source/drain forming, wells forming, substrate preclean, etc., in step 702. Pad oxide 870 may be formed over a surface of substrate 102 in both the memory or logic regions. In one embodiment, pad oxide 860 may be silicon dioxide ($SiO_2$) having a thickness of from about 10 nanometers (nm) to about 20 nm and may be formed in an ALD chamber using radical oxidation or oxide deposition process as previously described, or other oxidation or deposition processes known in the art. It will be the understanding that pad oxide 870 may not be necessary, or formed in some embodiments. Dopants are implanted into substrate 102 through pad oxide 870 (if present) to form wells (deep and shallow), source/drain, or channels for one or more of NVM transistor 100 and pass transistor 602 in the memory region; and MOS transistors 604, 606, 608 in the logic region. It will be the understanding that one or more pre-steps may be carried out later on in the fabrication process without deviating from the principle of the present disclosure.

Figure 8A:
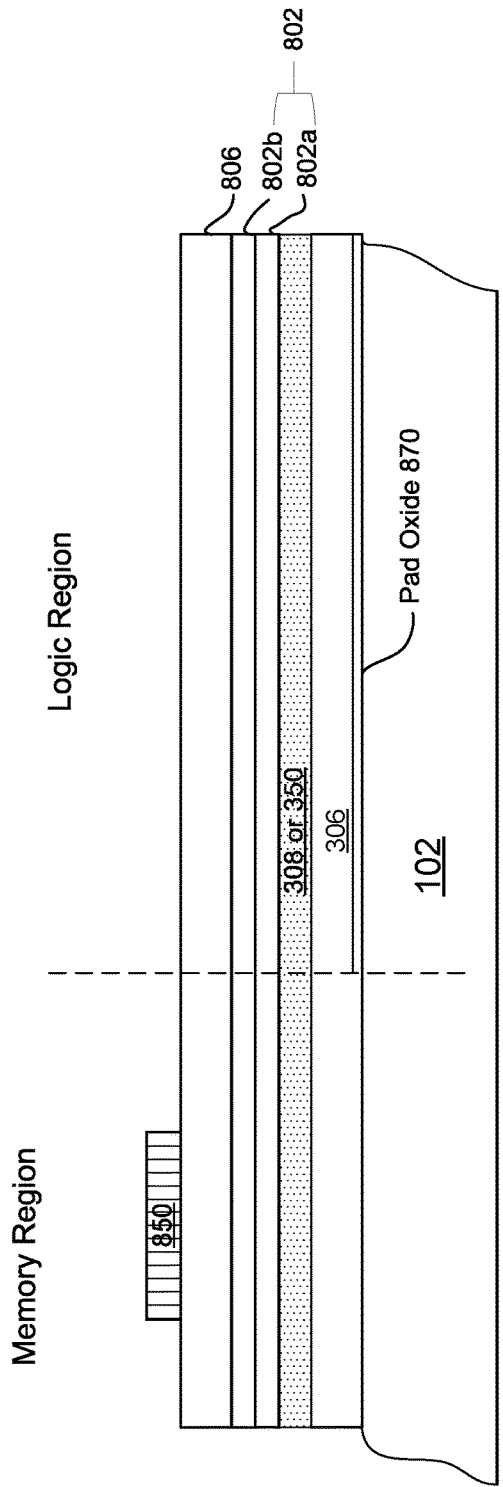
FIGS. 8A-8E are representative diagrams illustrating cross-sectional views of a portion of a SONOS based memory device according to the method of FIG. 7.

Next, referring to FIGS. 7 and 8A, the surface of substrate 102 in the memory region is cleaned or pre-cleaned, a number of dielectric layers are formed in steps 704 and 706. Subsequently, a mask is formed on or overlying the dielectric layers, and the dielectric layers are etched to form NV gate stack in the memory region, in step 706. The preclean may be a wet or dry process to remove pad oxide 870 (at least in the memory region) over substrate 102.

Referring to FIGS. 7 and 8A, the dielectric or NV gate stack layer process begins with the formation of tunnel dielectric layer 306 in the memory region and may spread over to the logic region where MOS transistors 604, 606, 608 to be formed, in step 704. In one embodiment, tunnel dielectric layer 306 may be any material and have any thickness suitable to allow charge carriers to tunnel into an overlying charge-trapping layer under an applied gate bias while maintaining a suitable barrier to leakage when multi-level NVM transistor 926 is unbiased. As previously described at least in FIGS. 2 and 3A-3D and their corresponding description, in a preferred embodiment, tunnel dielectric layer 306 may include one or more sub-layers of silicon oxide formed by radical oxidation or ALD oxide deposition process steps in an ALD chamber, such as ALD chamber 90 in FIG. 2B. By controlling and modifying the process parameters, such as flow rate, reactants, time duration, temperature, etc. in the radical oxidation process(es) and ALD deposition process(es), tunnel dielectric layer 306 with customizable and desirable thickness (WTW and WIW), uniformity, oxide-silicon substrate interface conditions, film stoichiometry may be achieved.

Referring again to FIG. 8A, charge trapping layer 308 or 350 is formed on or overlying the tunnel dielectric 306, in step 704. In one embodiment, charge trapping layer 308 or 350 may be multi-layer silicon nitride (one or more sub-layers) formed by ALD deposition process steps as previously described in FIGS. 4A-4E and their respective description. In one embodiment, as best shown in FIG. 4E, the charge-trapping layer may be a multi-layer charge trapping layer 308 having at least one sub-layer (e.g. 308a-308c as best shown in FIG. 4C, and each sub-layer may have different thickness, film ratio of Si, O, N, or other physical and chemical characteristics by finetuning the ALD deposition process steps.

In another embodiment, charge trapping dielectric layer 350 is an N—O—N layer comprising multiple layers including at least a lower charge trapping layer 308' that is physically closer to the tunnel dielectric layer 306, and an upper charge trapping layer 332 that has one or more nitride sub-layer and oxygen-lean relative to the oxygen-rich lower charge trapping layer 308' that also has one or more sub-layer, and comprises a majority of a charge traps distributed in multi-layer charge trapping layer 350. As best shown in FIG. 4E, there may be a thin oxide film formed between the upper and lower charge trapping dielectric layers 332 and 308' to substantially reduce the probability of electron charge that accumulates at the boundaries of the upper charge trapping layer 332 during programming from tunneling into the lower charge trapping layer 308', resulting in lower leakage current than for the conventional memory devices. In one embodiment, all sub-layers of charge trapping dielectric layer 308 or 350 can be form within the same ALD chamber (is-situ) by radical oxidation, oxide deposition or nitride deposition process steps.

Referring again to FIGS. 7 and 8A, cap layer 802 is formed on or overlying charge trapping layer 308 or 350, in step 706. In some embodiments, such as that shown, cap layer 802 is a multi-layer cap layer including at least a lower or first cap layer 802a overlying the charge trapping layer 308 or 350, and a second cap layer 802b overlying the first cap layer 802a.

In one embodiment, first cap layer 802a may include a high-temperature-oxide (HTO), such as silicon oxide ($SiO_2$), having a thickness of between 2.0 nm and 4.0 nm deposited using a low pressure chemical vapor deposition (LPCVD) thermal oxidation process. In one embodiment, second cap layer 802b may include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures. In another embodiment, cap layer 802 may also be formed in the ALD chamber using radical oxidation or oxide or nitride deposition process steps as described in previous paragraphs, such as Table 1-3 and their respective description.

Referring still to FIGS. 7 and 8A, sacrificial oxide layer 806 is formed on or overlying cap layer 802, in step 706. In one embodiment, sacrificial oxide layer 802 may include a high-temperature-oxide (HTO) layer grown by a thermal oxidation process or radical oxidation, and having a thickness of between 2.0 nm and 4.0 nm. In another embodiment, sacrificial oxide layer 806 may be formed in an ALD chamber using radical oxidation or oxide deposition process steps as previously described.

Figure 8B:
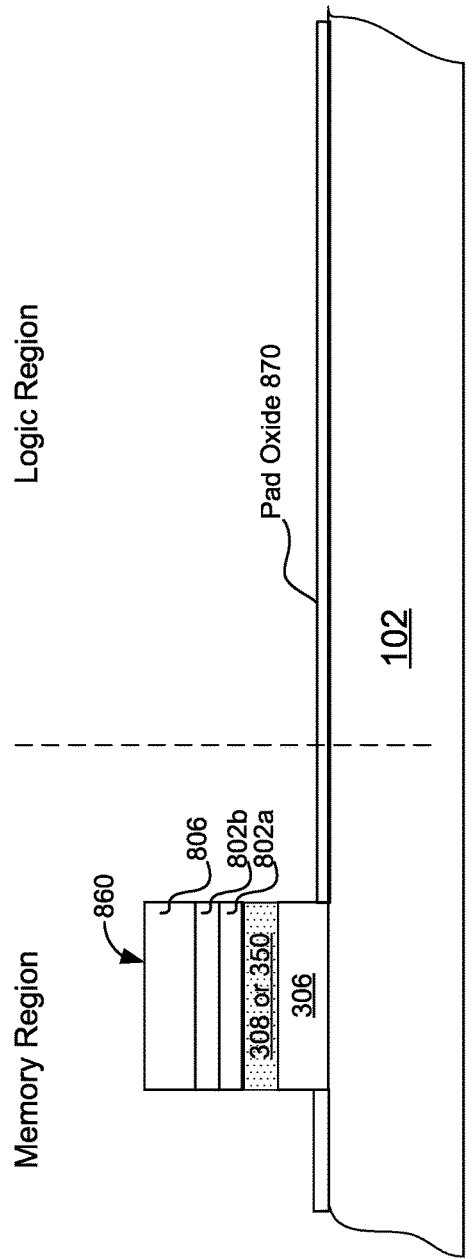

Next, still referring to FIGS. 7 and 8A, a patterned mask layer 850 is formed on or overlying the sacrificial oxide layer 802, and referring to FIG. 8B, the sacrificial oxide layer 806, cap layer 802 and charge trapping layer 308 or 350, and tunnel dielectric layer 306 are etched or patterned to form NV gate stack 860. In one embodiment, NV gate stack 860 may be disposed substantially overlying the channel of NVM transistor 100 in the memory region. The etching or patterning process may further remove various dielectric layers of NV gate stack 860 from the logic region (step 706). The patterned mask layer 850 may include a photoresist layer patterned using standard lithographic techniques, and the NV gate stack 860 layers in the logic region may be etched or removed using a dry etch process including one or more separate steps to stop on a surface of substrate 102 or unremoved pad oxide 870 (if any). In one embodiment, wells (not shown) may be formed in the logic area. It will be the understanding that FIG. 8B is a representative diagram and one or multiple NV gate stacks 860 may be formed in the memory region or other regions on substrate 102 in the same patterning process step.

Figure 8C:

Referring to FIGS. 7 and 8C, sacrificial oxide layer 806 and a top portion or substantially all of second cap layer 802b in the multi-layer cap layer 802 are removed from NV gate stack 860 in a highly selective cleaning process (step 708). This cleaning process further removes any oxide, such as oxide in tunnel dielectric layer 306 and/or pad oxide 870, remaining in the memory region beyond NV gate stack 860, and in the logic region to prepare substrate 102 for oxide formation.

Figure 8D:
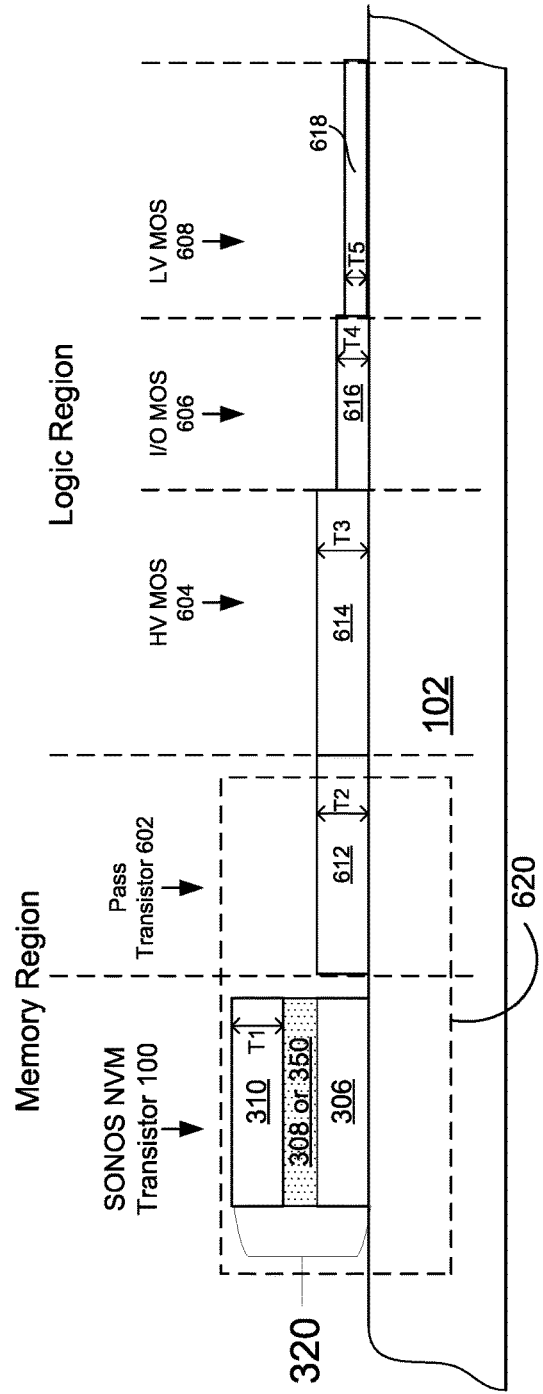

Next, referring to FIG. 7 and FIG. 8D, blocking dielectric layer 310 of NVM transistor 100, pass transistor gate oxide 612 (if present for 2T configuration) in the memory region; and LV gate oxide layer 618, I/O gate oxide layer 616, and HV gate oxide layer 614 are formed, in step 710. In one embodiment, an oxidation process is performed to oxidize the remaining portion of second cap layer 802b and/or the first cap layer 802a of multi-layer cap layer 802, and optionally, a portion of charge trapping dielectric layer 308 or 350 to form blocking dielectric layer 310 overlying charge trapping dielectric layer 308 or 350. In one embodiment, the oxidation process is adapted to oxidize or consume first cap layer 802a, or the remaining portion of second cap layer 802b, or optionally a portion of charge trapping dielectric layer 308 or 350 to form the blocking dielectric layer 310 and gate oxide layer 612 of pass transistor 602 (if present) in the memory region, while simultaneously oxidizing at least a portion of substrate 102 where I/O MOS 606 or LV MOS 608 or HV MOS 604 will be disposed to form gate oxide layer(s) in the logic region. In one embodiment, the oxidation process may include in-situ radical oxidation performed in an ALD chamber, such as ALD chamber 90. The in-situ radical oxidation processes may resemble the ALD radical oxidation process step(s) described in Table 1, FIGS. 5A-5C and their corresponding description, wherein one or more silicon oxide sub-layer (e.g. 310a-310c as best shown in FIG. 5B) is formed in the NVM transistor 100 in the memory area. In one embodiment, silicon oxide in blocking dielectric layer 310 is formed by radicals reacting or ultimately converting the nitride or oxynitride in cap layer 802, or possibly a top portion of charge trapping dielectric layer 308 or 350. In one embodiment, simultaneously, radicals, such as, an OH radical, an $HO_2$ radical or an O diradical radicals generated during the in-situ ALD radical oxidation process step(s) may also react and consume silicon substrate 102 to form one or more sub-layer in pass transistor gate oxide 612 in the memory region, and in gate oxide layers 612, 614, 616 in the logic region. Process parameters (e.g. Table 1) of the in-situ ALD radical oxidation process steps may be modified to produce oxide sub-layers of different thicknesses, quality, uniformity, stoichiometry, or other chemical and physical characteristics in both the memory and logic regions. Radical oxidation process steps may also be repeated, alternatively repeated, modified, such that an ideal thickness T1 for blocking dielectric layer 310, T2 for gate oxide layer 612 of pass transistor, and T3, T4, T5 for gate oxide layers 614, 616, 618 of respectively HV MOS 604, I/O MOS 606, LV MOS 608 are achieved. In one embodiment, T1 may be in the approximate range of 30-50 Å, T2 50-150 Å, T3 50-150 Å, T4 50-150 Å, and T5 10-30 Å.

Alternatively or additionally, in the same ALD chamber, in-situ ALD oxide deposition (e.g. Table 2 or modification) may also be carried out to generate one or more oxide sub-layer in at least one of blocking dielectric layer 310 and gate oxides 612, 614, 616, 618. As previously described in Table 2, FIGS. 5A-5C and their respective description, radicals generated in the ALD chamber may react to silicon source gas e.g. HCD or oxynitride/nitride or silicon substrate to form one or more silicon oxide sub-layer. In embodiments, the in-situ ALD oxide deposition process steps and radical oxidation process steps, which may be carried out in the same ALD chamber, may be repeated, modified, alternated, and a combination thereof until pre-determined thicknesses T1-T5 of respective dielectric/oxide layers 310, 612, 614, 616, 618 are achieved. In alternative embodiments, at times, the in-situ ALD oxide deposition process steps or radical oxidation process steps may not be applied to all regions. Masks (not shown) may be applied to protect one or more regions such that gate oxide layer(s) therein is unaffected by subsequent radical oxidation or ALD oxide deposition process steps. In one example, gate oxide layer 618 of LV MOS 608 in the logic region may be protected with a mask (not shown) after thickness T5 is achieved so no further oxide will be added to its thickness in subsequent in-situ ALD process steps (radical oxidation, deposition, or both). In another example, gate oxide layer 612 of pass transistor 602 and gate oxide layer 614 of HV MOS 604 may be approximately the same and be formed, concurrently or sequentially, in the same process steps. One major object and advantage of fabricating blocking dielectric layer 310 of NVM transistors and one or more of gate oxides of MOS transistors 602, 604, 606, 608 in in-situ ALD process steps (both radical oxidation and oxide deposition) in a same or similar ALD chamber/tool is that oxide sub-layers and layers are formed with a relatively low thermal budget (below 650° C.) so the CMOS process flow in the logic region may not be adversely affected. Another object and advantage is that both the N—O—N stack 320 of NVM transistor 100 and gate oxide layers 612, 614, 616, 618 are each highly customizable by changing the configuration of the in-situ process steps in the ALD chamber or tool. In one embodiment, ONO layer of the SONOS transistor(s) and gate oxide layers 612, 614, 616, 618 of all FETs are all formed in situ within the same ALD chamber or tool.

In an alternative embodiment, at least a portion of gate oxide layers 612, 614, 616, 618, may be formed using RTO, furnace oxidation, radical oxidation, CVD, in-situ steam generation (ISSG), or combinations thereof. Those oxidation process steps may be carried out in separated process tools.

Figure 8E:
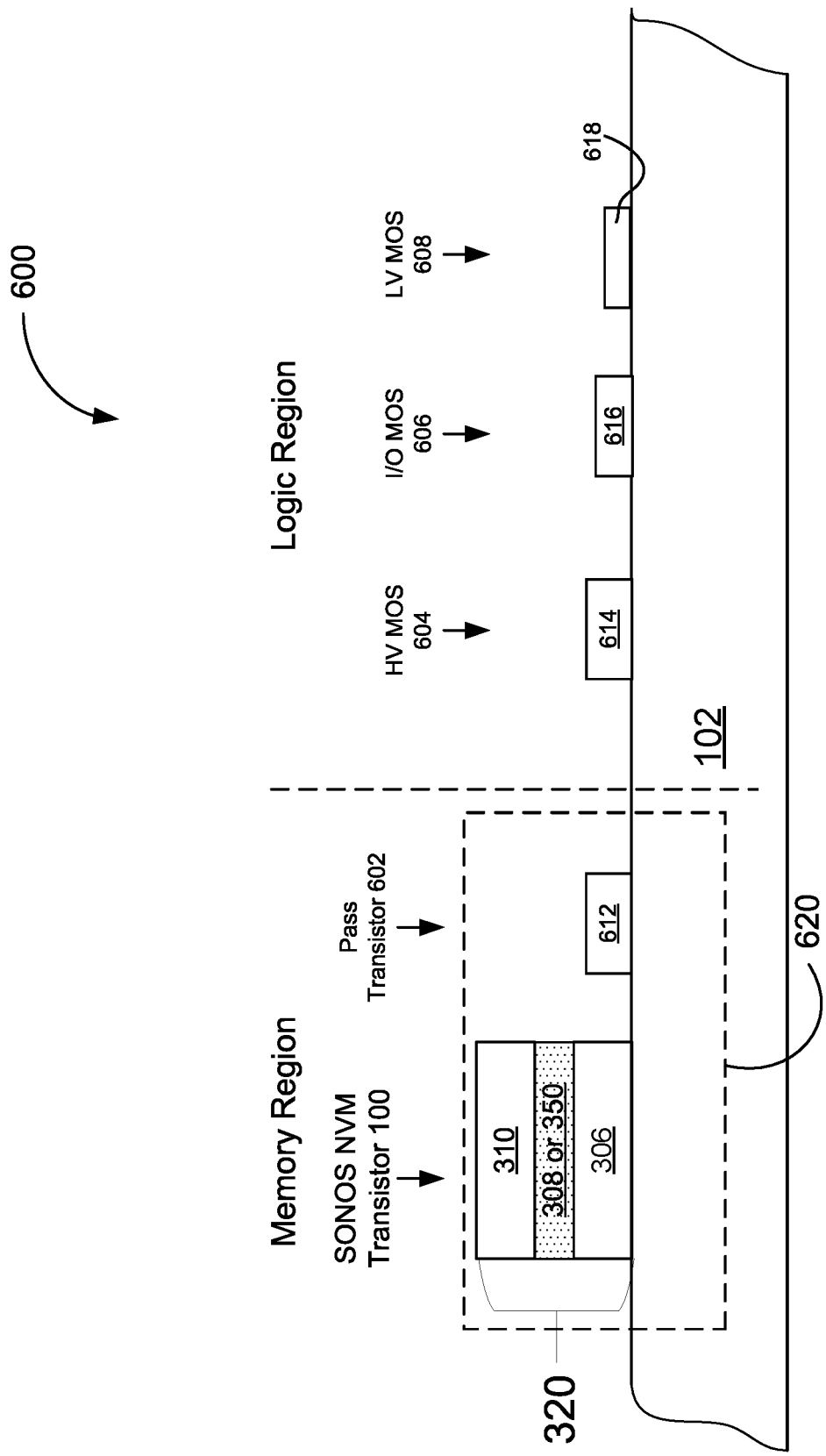

In embodiments, LV gate oxide layer 618, I/O gate oxide layer 616, and HV gate oxide layer 614 may be formed simultaneously or individually. Subsequently and best shown in FIG. 8E, LV gate oxide layer 614, I/O gate oxide layer 616, and HV gate oxide layer 614 are patterned, in step 710. Although only one of each type of transistors (SONOS NVM, pass, HV MOS, I/O MOS, LV MOS transistors) are shown, it will be the understanding that multiple transistors of each type (not shown in FIG. 8D) may be fabricated simultaneously or subsequently using the aforementioned method and process steps.

Finally, the standard or baseline CMOS process flow is continued to substantially complete the front end device fabrication (step 712). The process flow may include forming HKMGs, spacers, channels, source/drain regions, etc. for each type of transistors. In one embodiment, completed NVM transistor 100 and HV, I/O or LV MOS transistor 604, 606, 608 may be configured to form an embodiment of a NVM cell 620. In alternative embodiment, pass transistor 602 may have a different structure, such as gate oxide thickness, from HV, I/O or LV MOS transistor 604, 606, 608. In another alternative embodiment, memory cell 620 may only contain NVM transistor 100 in a one transistor configuration.

Thus, embodiments of a SONOS based non-volatile memory and methods of fabrication including customizable O—N—O stack and methods of integration to a baseline CMOS process flow are presented. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A method of fabrication of a semiconductor device, comprising:
   dividing a substrate into first and second regions;
   forming a customizable oxide-nitride-oxide (ONO) stack in the first region, comprising:
   performing at least one of a first radical oxidation and a first oxide deposition process steps in an atomic layer deposition (ALD) tool to form a tunnel dielectric layer overlying the substrate;
   performing a plurality of silicon nitride deposition process steps in the ALD tool to form a multi-layer charge trapping (CT) layer, comprising:
   determining process parameters of a first silicon nitride deposition process step of the plurality of silicon nitride deposition process steps to form a first CT sub-layer;
   modifying at least one of the process parameters;
   performing a second silicon nitride deposition process step to form a second CT sub-layer overlying the first CT sub-layer; and
   performing at least one of a second radical oxidation and a second oxide deposition process steps in the ALD tool to form a blocking dielectric layer overlying the multi-layer CT layer in the first region, wherein the multi-layer CT layer includes at least three CT sub-layers, and wherein the process parameters of the plurality of silicon nitride deposition process steps are modified such that a top CT sub-layer that is adjacent to the blocking dielectric layer is the most oxygen-lean and a bottom CT sub-layer that is adjacent to the tunnel dielectric layer is the most oxygen-rich in the multi-layer CT layer.

2. The method of claim 1, wherein the silicon nitride includes silicon oxynitride that includes oxygen.

3. The method of claim 1, wherein the customizable ONO stack formation process steps are in situ and performed in a same ALD tool.

4. The method of claim 1, wherein film composition of silicon nitride of silicon, oxygen, and nitrogen, in the first and second CT sub-layers are different.

5. The method of claim 1, wherein the first CT sub-layer is oxygen-rich silicon nitride resulting in it being substantially charge trap free and the second CT sub-layer is oxygen-lean silicon nitride resulting in it being substantially charge trap dense.

6. The method of claim 5, further comprising:
performing a plurality of third silicon nitride deposition process steps to form a plurality of third CT sub-layers disposed between the first and second CT sub-layers, wherein process parameters of the plurality of third silicon nitride deposition process steps are adjusted such that oxygen-richness level of the plurality of third CT sub-layers is between oxygen-richness level of the first and second CT sub-layers.

7. The method of claim 5, further comprising:
performing at least one of a third radical oxidation and a third oxide deposition process steps in the ALD tool to form a thin oxide film overlying the first CT sub-layer and underneath the second CT sub-layer, wherein the thin oxide film is formed to reduce electron charge that accumulates at boundaries of the second CT layer from tunneling into the first CT layer.

8. The method of claim 1, wherein process parameters of the first and second radical oxidation process steps comprise:
types of reactant gas including $O_2/H_2$ gas;
flowrate of the reactant gas into the ALD tool;
reaction time for each reactant gas;
sequence of the reactant gas entering the ALD tool; and
a number of repeating and repeating sequence, wherein the process parameters are configured to control at least one of thickness, density, quality of oxide formed in the tunnel dielectric layer.

9. The method of claim 1, wherein the process parameters of the first and second oxide deposition process steps comprise:
types of silicon source precursor gas including hexachlorodisilane (HCD);
types of reactant gas including $O_2/H_2$ gas;
flowrate of the reactant gas and silicon source precursor gas;
reaction time for each of the reactant gas and silicon source pre-cursor gas; and
sequence of the reactant gas and silicon source pre-cursor gas entering the ALD tool, wherein the process parameters are configured to control at least one of thickness, density, quality of oxide formed in the blocking dielectric layer.

10. The method of claim 1, wherein the process parameters of the first and second silicon nitride deposition process steps comprise:
types of silicon source precursor gas including hexachlorodisilane (HCD);
types of reactant gas including $NH_3/N_2O$ gas;
flowrate of the reactant gas and silicon source precursor gas; and
reaction time for each of the reactant gas and silicon source precursor gas;
sequence of the reactant gas and silicon source pre-cursor gas entering the ALD tool; and
a number of repeating and repeating sequence.

11. The method of claim 1, wherein at least one of the plurality of silicon nitride deposition process steps are plasma enhanced.

12. The method of claim 1, wherein:
the first radical oxidation and the first oxide deposition process steps are individually repeated, alternatively repeated, or a combination thereof to form the tunnel dielectric layer; and
the second radical oxidation and the second oxide deposition process steps are individually repeated, alternatively repeated, or a combination thereof to form the blocking dielectric layer, wherein process parameters of the first and second radical oxidation process steps and the first and second oxide deposition process steps are adjusted during repeating of process steps to customize the tunnel dielectric layer and the blocking dielectric layer.

13. The method of claim 1, further comprising:
forming a high voltage (HV) gate oxide layer, an input/output (I/O) gate oxide layer, and a low voltage (LV) gate oxide layer in the second region of the substrate, wherein at least one of the HV, I/O, and LV gate oxide layers are formed concurrently with the blocking dielectric layer of the customizable O—N—O layer in the first region by the at least one of the second radical oxidation and the second oxide deposition process steps.

14. A method of fabrication of a memory device, comprising:
forming a tunnel oxide layer in a memory region and a logic region of a substrate;
forming a customizable charge trapping (CT) layer and a cap layer overlying the tunnel oxide layer, wherein the customizable CT layer includes multiple CT sub-layers, and wherein each of the CT sub-layers is formed by one or more silicon nitride deposition process step performed in an atomic layer deposition (ALD) chamber, having process parameters including:
types of silicon source pre-cursor gas including hexachlorodisilane (HCD);
types of reactant gas including $NH_3/N_2O$ gas;
flowrate of the reactant gas and silicon source pre-cursor gas;
reaction time for each of the reactant gas and silicon source pre-cursor gas; and
sequence of the reactant gas and silicon source pre-cursor gas entering the ALD chamber;
patterning the tunnel oxide, customizable CT, and cap layers to form a memory stack in the memory region while removing the tunnel oxide, customizable CT, and cap layers in the logic region; and
performing at least one radical oxidation process step in the ALD chamber to concurrently convert silicon nitride in at least the cap layer to form a blocking oxide layer overlying the customizable CT layer and convert silicon in the substrate to form a first gate oxide layer in the logic region.

15. The method of claim 14, further comprising:
performing at least one oxide deposition process step in the ALD chamber to concurrently add thickness to the blocking oxide layer and the first gate oxide layer in the logic region.

16. The method of claim 14, wherein the process parameters of the one or more silicon nitride deposition process steps are adjusted to produce the CT sub-layers having at least one of different thickness, density, and film composition of Si, O, and N of silicon nitride in the CT sub-layers.

17. A method of fabrication of a semiconductor-oxide-nitride-oxide-semiconductor (SONOS) based memory device, comprising:
forming a memory cell including a SONOS transistor and a pass transistor in a memory region of a substrate, including:
forming a tunnel oxide layer in the memory region and a logic region of the substrate;
forming a customizable charge trapping (CT) layer and a cap layer overlying the tunnel oxide layer, wherein the customizable CT layer includes at least three CT sub-layers, and wherein each of the CT sub-layers is formed by one or more silicon nitride deposition process step performed in an atomic layer deposition (ALD) chamber, wherein process parameters of the one or more silicon nitride deposition process step are modified such that a top CT sub-layer of the at least three CT sub-layers is the most oxygen-lean and a bottom CT sub-layer that is adjacent to the tunnel oxide layer is the most oxygen-rich in the customizable CT layer;
patterning the tunnel oxide, customizable CT, and cap layers to form a memory stack in the memory region while removing the tunnel oxide, customizable CT, and cap layers in the logic region; and
forming a blocking oxide layer overlying the customizable CT layer and a first gate oxide of the pass transistor in the memory region; and forming a high voltage (HV) gate oxide layer of a HV transistor, an input/output (I/O) gate oxide layer of an I/O transistor, and a low voltage (LV) gate oxide layer of a LV transistor in the logic region, wherein at least one of the HV, I/O, and LV gate oxides are formed at least partly by performing at least one radical oxidation process step in the ALD chamber to concurrently convert silicon nitride in at least the cap layer to form the blocking oxide layer and silicon to form the first gate oxide in the memory region, and convert silicon in the substrate to form at least partly the at least one of the HV, I/O, and LV gate oxides in the logic region.

18. The method of claim 17, further comprising:
performing at least one oxide deposition process step in the ALD chamber to concurrently add thickness to the blocking oxide layer and the first gate oxide layer in the memory region.

19. The method of claim 17, wherein the pass transistor and the HV transistor are of a same type, and wherein the first gate oxide and the HV gate oxide are formed concurrently and have approximately a same thickness.

20. The method of claim 17, wherein the process parameters of the one or more silicon nitride deposition process steps are adjusted to produce the CT sub-layers having different film compositions of Si, O, and N of silicon nitride in the CT sub-layers, and wherein a top CT sub-layer is the most oxygen-lean and a bottom CT sub-layer is the most oxygen-rich in the customizable CT layer.

21. The method of claim 18, wherein the oxide deposition process steps, the radical oxidation process steps, and the silicon nitride deposition process steps are performed in situ in the ALD chamber and process temperatures are controlled at below 650° C.

22. The method of claim 17, further comprising:
forming high-K metal gates (HKMG) overlying the blocking oxide of the SONOS transistor and the first gate oxide layer of the pass transistor.

* * * * *